(12) United States Patent
Hashimoto et al.

(10) Patent No.: US 7,088,746 B2
(45) Date of Patent: Aug. 8, 2006

(54) LASER MODULE

(75) Inventors: Jun-ichi Hashimoto, Yokohama (JP); Seiji Takahashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 206 days.

(21) Appl. No.: 10/766,029

(22) Filed: Jan. 29, 2004

(65) Prior Publication Data

US 2004/0213317 A1    Oct. 28, 2004

(30) Foreign Application Priority Data

Feb. 28, 2003    (JP)    ............................ P2003-054691

(51) Int. Cl.
*H01S 3/098*    (2006.01)
*H01S 3/04*    (2006.01)
*H01S 3/08*    (2006.01)

(52) U.S. Cl. ............................ 372/19; 372/92; 372/96; 372/102; 372/36

(58) Field of Classification Search .................. 372/19, 372/92, 96, 102
See application file for complete search history.

(56) References Cited

U.S. PATENT DOCUMENTS 6,625,182    B1 *    9/2003    Kuksenkov et al. ........... 372/19
2002/0168153    A1    11/2002    Yamabayashi et al.

FOREIGN PATENT DOCUMENTS

| GB | 2110835 A | * | 6/1983 |
|---|---|---|---|
| JP | 2000-082864 | | 3/2000 |
| JP | 2002-033553 | | 1/2002 |
| JP | 2002-043689 | | 2/2002 |
| JP | 2003-008141 | | 1/2003 |

OTHER PUBLICATIONS

Hashimoto, et al., Uncooled Fiber-Bragg-Grating External-Cavity Semiconductor Laser Module for 1.55 um CWDM Networks, The Institute of Electronics, Information and Communication Engineers, Technical Report of IEICE; pp. 1-6, (2002), (written in Japanese).

Toshio Takagi, et al., "Fiber-Grating External-Cavity Laser Diode Module for 2.5 Gb/s Dense WDM Transmission", ECOC, Sep. 1998, pp. 81-82.

(Continued)

*Primary Examiner*—Minsun Harvey
*Assistant Examiner*—Marcia A. Golub
(74) *Attorney, Agent, or Firm*—Smith, Gambrell & Russell, LLP

(57) ABSTRACT

Provided is a fiber grating laser for optical communication which can be used as a light source regardless of the occurrence of mode hopping. The laser module comprises a semiconductor optical amplifier device, an optical waveguide such as an optical fiber, and a diffraction grating such as a fiber grating. The semiconductor optical amplifier device has first and second end surfaces. The optical waveguide is optically coupled to the semiconductor optical amplifier device. The diffraction grating is optically coupled to the optical waveguide. The semiconductor optical amplifier device and the diffraction grating constitute an external cavity. An optical cavity length of the external cavity is in a range of 13 millimeters or more but 27 millimeters or less.

10 Claims, 24 Drawing Sheets

OTHER PUBLICATIONS

Takashi Kato, et al., Fiber-Grating Semiconductor Laser Modules for Dense-WDM Systems, pp. 357-359, IEICE Trans. Electron, vol. E82-C, No. 2, Feb. 1999.

G.D. Maxwell, et al., "Demonstration of a semiconductor external cavity laser using a UV written grating in a planar silica waveguide", Electronics Letters, 1st Sep. 1994, vol. 30, No. 18, pp. 1486-1487.

T. Tanaka, et al., "Hybrid integrated external cavity laser without temperature dependent mode hopping", Electronics Letters, 21st Jan. 1999, vol. 35, No. 2, pp. 149-150.

T. Tanaka, et al., "100 GHz-spacing 8-channel light source integrated with gratings and LDs on PLC platform", The Institute of Electronics, Information and Communication Engineers, Technical Report of IEICE, (2002), pp. 25-29 (written in Japanese) (with English Abstract).

T. Tanaka, et al., "Integrated external cavity laser composed of spot-size converted LD and UV written grating in silica waveguide on Si", Electronics Letters, 20th Jun. 1996, vol. 32, No. 13, pp. 1202-1203.

Hashimoto et al., "Eight-Channel Wavelength Multiplexing With 200-GHz Spacing Using Uncooled Coaxial Fiber Bragg Grating External-Cavity Semiconductor Laser Module", IEEE Photonics Technology Letters, vol. 14, No. 11, pp. 1617-1619, Nov. 2002.

Translation of portion of Notice of Rejection from JPO.

F.N. Timofeev et al., "10Gbit/s directly modulated, high temperature-stability external fibre grating laser for dense WDM networks", Electronics Letters vol. 35, No. 20 (1999) p. 1737-1739.

* cited by examiner

WAVELENGTH (nm)

WAVELENGTH (nm)

WAVELENGTH (nm)

LASER MODULE

BACKGROUND OF THE INVENTION

1. Field of the Invention

The present invention relates to a laser module for optical communication.

2. Related Background of the Invention

A fiber grating laser is described in the following literature, which discloses the related art in this field: "Technical Report of IEICE, EMD2002-24, CPM2002-66, OPE2002-46, LQE2002-101 (2002-08), The Institute of Electronics, Information and Communication Engineers." This fiber grating laser does not include a peltier element and is therefore a non-temperature controlled type device. The fiber grating laser exhibits temperature dependency of a wavelength and electric-current dependency thereof which are superior to those of a distributed feedback (DFB) semiconductor laser. An oscillation wavelength of the fiber grating laser is defined by a correlation between a longitudinal mode of an external optical cavity, which is constituted by a semiconductor optical amplifier device and a fiber grating, and a reflection characteristic of the fiber grating. As shown in FIG. 2 of the literature, the fiber grating laser is configured to include at least one longitudinal-mode line within a reflection bandwidth of the fiber grating. Moreover, as shown in FIG. 4 of the literature, the fiber grating laser is small in size.

SUMMARY OF THE INVENTION

In the fiber grating laser, the longitudinal mode closest to the Bragg wavelength of the fiber grating oscillates. This Bragg wavelength has temperature dependency which is attributable to physical property values of a constituent material such as silica glass. A temperature characteristic of a fiber grating made of silica glass is about 10 picometers per degree, which does not substantially depend on an injection current to the semiconductor optical amplifier device. As a result, the fiber grating laser exhibits less dependency on variations in the injection current and in the ambient temperature as compared with a DFB semiconductor laser device.

However, in the fiber grating laser, the longitudinal mode of the oscillation wavelength relates to a length of an external cavity and varies in accordance with the temperature. In addition, the Bragg wavelength of the fiber grating also varies in accordance with the temperature. A rate of change in the longitudinal mode due to temperature is greater than a rate of change in the Bragg wavelength due to temperature. Resultantly, mode hopping occurs when the temperature changes. In the mode hopping, when the longitudinal mode corresponding to the oscillation wavelength changes from the current longitudinal mode to an adjacent longitudinal mode on a shorter wavelength side, the oscillation wavelength discretely changes from the current wavelength to an adjacent wavelength on the shorter wavelength side.

The occurrence of mode hopping may cause deterioration in a transmission characteristic. Therefore, in order to avoid the occurrence of mode hopping, an attempt has been made to approximate the temperature dependency of the Bragg wavelength of the fiber grating to the temperature dependency of the longitudinal mode of the fiber grating laser. Realization of so-called mode-hop-free tuning is studied. However, it is difficult to completely match the rate of change in the longitudinal mode of the fiber grating laser due to temperature with the rate of change in the Bragg wavelength of the fiber grating due to temperature, and in reality, the mode-hop-free tuning is achieved only in a limited temperature range. In addition, mode-hop-free tuning causes an increase in costs associated with complication in structure and material. Practical application of mode-hop-free tuning has been difficult from this viewpoint as well.

During mode hopping, two or more adjacent longitudinal modes of the fiber grating laser compete with one another. Observing an oscillation spectrum of the fiber grating laser that is exhibiting mode hopping, two or more adjacent longitudinal modes oscillate with equivalent intensities. In other words, the fiber grating laser oscillates in multimode.

In optical communication, single-mode light is used as signal light for long-distance communication. This is because unignorable waveform distortion occurs in a transmission pulse in long-distance communication due to the group delay of the multimode when using multimode light as the signal light, and thereby a transmission characteristic is deteriorated.

To obtain single-mode light at a practical ambient temperature from the fiber grating laser without being bothered by the mode hopping, a peltier element is used for adjusting the temperature of the semiconductor optical amplifier device. The use of the peltier element causes an increase in the costs of the fiber grating laser. It is hardly possible to use a temperature controlled type fiber grating laser unless an application thereof can accept such a cost increase.

Meanwhile, a low-cost light source has been desired for optical communication systems such as a metro system and an access system. One of candidates for the light source in these optical communication systems is an non-temperature controlled type (uncooled) fiber grating laser.

Accordingly, extensive studies have been conducted to realize the uncooled fiber grating laser. As a result, the inventors have reached an invention of a laser module which is usable as a light source for optical communication regardless of the occurrence of mode hopping.

It is an object of the present invention to provide a laser module for optical transmission, the laser module usable as a light source for long-distance communication regardless of the occurrence of mode hopping.

According to an aspect of the present invention, a laser module comprises an external cavity including (a) a semiconductor optical amplifier device having first and second end surfaces, (b) a grating fiber having an end and a diffraction grating, and (c) a lens for optically coupling the first end surface and the end together. Here, an optical cavity length of the external cavity is in a range of 13 millimeters or more but 27 millimeters or less.

According to another aspect of the present invention, a laser module comprises (a) a semiconductor optical amplifier device having first and second end surfaces, (b) a grating fiber having an end and a diffraction grating, and (c) a component-mounted member for configuring an external cavity by optically coupling the semiconductor optical amplifier device and the grating fiber together. Here, the component-mounted member includes an abutting surface on which the end of the grating fiber is abutted; the component-mounted member mounts the semiconductor optical amplifier device; and an optical cavity length of the external cavity is in a range of 13 millimeters or more but 27 millimeters or less.

According to still another aspect of the present invention, a laser module comprises an external cavity including a semiconductor optical amplifier device having first and second end surfaces, and a planar optical waveguide having an end and a diffraction grating. Here, an optical cavity length of the external cavity is in a range of 13 millimeters or more but 27 millimeters or less.

According to yet another aspect of the present invention, a laser module comprises a semiconductor optical amplifier device having first and second end surfaces, an optical waveguide having an end optically coupled to the semiconductor optical amplifier device, and a diffraction grating optically coupled to the optical waveguide. Here, the semiconductor optical amplifier device and the diffraction grating constitute an external cavity, and an optical cavity length of the external cavity is in a range of 13 millimeters or more but 27 millimeters or less.

Whereas an optical cavity length of an external cavity is about 6 mm in a conventional laser module, the above-described laser modules have longer lengths of the external cavities. Accordingly, longitudinal mode intervals become narrower, and group delay distortion caused by multimode oscillation during mode hopping is thereby reduced. Thus, a fine transmission state is maintained during the mode hopping, and therefore the above-described laser modules can be used as light sources regardless of the occurrence of mode hopping. In this way, according to the present invention, a laser module for optical communication is provided, which is usable as a light source regardless of the occurrence of mode hopping.

In the laser module of the present invention, the end of the grating fiber may be a lens-shaped end portion. The lens-shaped end portion can further strengthen the optical coupling between the semiconductor optical amplifier device and the grating fiber, and the characteristics of the laser module are thereby improved.

In the laser module of the present invention, the semiconductor optical amplifier device may include a converting portion for converting a spot size of light emitted from the semiconductor optical amplifier device. The converting portion can convert the spot size of the light emitted from the semiconductor optical amplifier device and thereby further strengthen the optical coupling between the semiconductor optical amplifier device and the grating fiber. Accordingly, the characteristics of the laser module are improved.

In the laser module of the present invention, the diffraction grating may have a reflection spectrum and a full width at half maximum of the reflection spectrum may be set to 0.4 nanometer or below. With this reflection spectrum, as compared with the reflectivities of two longitudinal modes in the vicinity of the Bragg wavelength in a mode hopping region, reflectivities at wavelengths of longitudinal modes other than the foregoing two longitudinal modes become smaller.

For this reason, with this full width at half maximum, laser oscillation of the longitudinal modes other than the two longitudinal modes (primary modes) in the vicinity of the Bragg wavelength is suppressed and becomes weaker by 10 decibels (dB) or above than the primary modes, thus becoming an ignorable level. In other words, by using the diffraction grating with the full width at half maximum of 0.4 nanometer (nm) or below, two-mode oscillation is established in the mode hopping region and multimode oscillation in excess of two modes is thereby suppressed. Therefore, it is possible to suppress the occurrence of signal light containing wavelength components in multimode in excess of two modes in the laser module. Moreover, it is possible to prevent an increase in transmission delay attributable to the wavelength components in multimode in excess of the two modes. In this way, deterioration in transmission is further reduced.

In the laser module of the present invention, the diffraction grating may have a reflection spectrum, and a longitudinal mode interval of adjacent longitudinal modes in the external cavity may be set to a value within a full width at half maximum of the reflection spectrum. In this laser module, a plurality of longitudinal modes exists in the full width at half maximum of the reflection spectrum. Therefore, the plurality of longitudinal modes oscillates simultaneously during mode hopping and the oscillation shifts smoothly to the adjacent mode. In this way, it is possible to suppress output variation during the mode hopping.

The laser module of the present invention can be realized in some aspects described below.

The laser module of the present invention may further comprise (d) a mounting component which mounts the semiconductor optical amplifier device, (e) a lens holding member which is supported by the mounting component and holds the lens, (f) a ferrule which holds the grating fiber, and (g) a ferrule holding member which holds the ferrule and is supported by the mounting component. Here, the grating fiber has a first portion provided with the diffraction grating, and a second portion of a pigtail shape.

Moreover, the laser module of the present invention may further comprise (d) a mounting component which mounts the semiconductor optical amplifier device, (e) a lens holding member which is supported by the mounting component and holds the lens, (f) a ferrule which holds a fiber stub provided with the diffraction grating, and (g) a ferrule holding member which holds the ferrule and is supported by the mounting component.

Furthermore, the laser module of the present invention may further comprise (d) a component-mounted member having a first region and a second region which are provided along a predetermined axis. Here, the semiconductor optical amplifier device is mounted in the first region of the component-mounted member, the grating fiber is mounted in the second region of the component-mounted member, and the second region of the component-mounted member includes first and second supporting surfaces which support side surfaces of the grating fiber.

Another aspect of the present invention is a method of generating an optical signal. A longitudinal mode of a laser cavity of a laser module changes in accordance with the temperature, and in the laser module, mode hopping occurs at one mode hopping temperature at least. The method includes (a) a step of applying an electric signal to the laser module, (b) a step of generating laser signal light containing first and second wavelength components corresponding to two adjacent longitudinal modes from a laser module when an ambient temperature of the laser module is a mode hopping temperature, and (c) a step of generating laser signal light corresponding to a single longitudinal mode from the laser module when the ambient temperature of the laser module is different from the mode hopping temperature. Here, an interval between the first wavelength component and the second wavelength component is 90 picometers or below.

Another aspect of the present invention is a method of generating an optical signal. A longitudinal mode of a laser cavity of a laser module changes in accordance with the temperature, and in the laser module, mode hopping occurs at one mode hopping temperature at least. The method includes (a) a step of generating laser signal light containing first and second wavelength components corresponding to two adjacent longitudinal modes from a laser module by applying an electric signal to the laser module when an ambient temperature of the laser module is a mode hopping temperature, and (b) a step of generating laser signal light corresponding to a single longitudinal mode from the laser module by applying an electric signal to the laser module when the ambient temperature of the laser module is different from the mode hopping temperature. Here, an interval between the first wavelength component and the second wavelength component is 90 picometers or below.

In these method, the interval between the first wavelength component and the second wavelength component is 90 picometers or below. Accordingly, distortion of the optical signal due to the group delay distortion of the light caused by the first and second wavelength components is small. Therefore, there is no deterioration in transmission attributable to the group delay distortion in the mode hopping region.

The above-described object, other objects, characteristics, and advantages of the present invention will become apparent more easily by the detailed description of the preferred embodiments of the present invention to be implemented below with reference to the accompanying drawings.

DESCRIPTION OF THE PREFERRED EMBODIMENTS

Figure 1A:
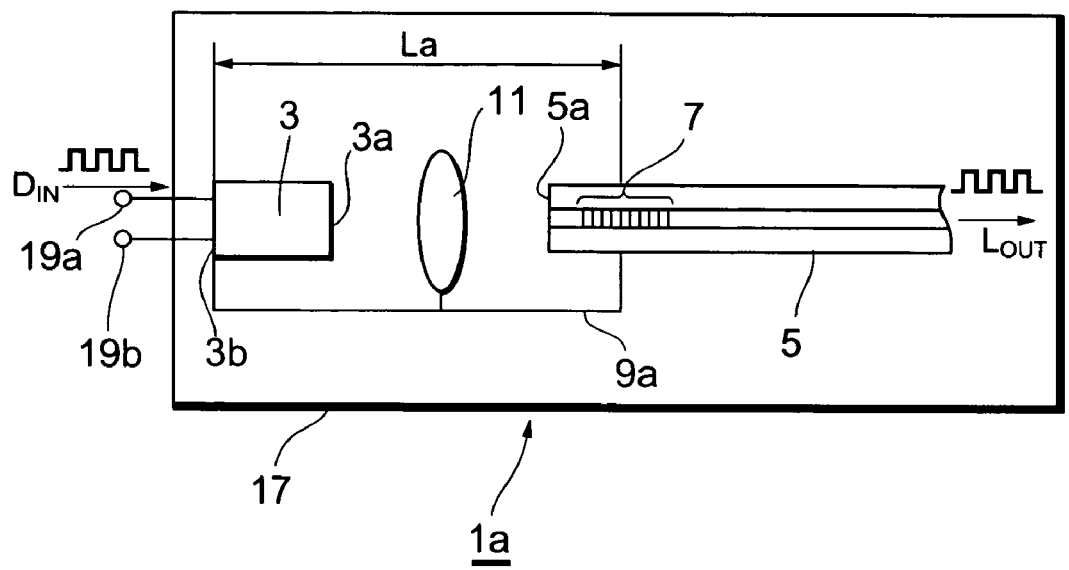
FIGS. 1A and 1B are views showing configurations of laser modules.

The knowledge of the present invention can be easily understood by considering the following detailed description with reference to the accompanying drawings presented herein as examples. Now, embodiments of a laser module of the present invention will be described with reference to the accompanying drawings. The same components are designated by the same reference characters when possible. Although the embodiments will be described in the case of an optical communication wavelength region of 1.55 micrometers, it is to be understood that the scope of the present invention is not limited to the foregoing, and that the present invention can be embodied in any arbitrary wavelength region.

First Embodiment

FIGS. 1A, 1B, 2A, 2B, and 24 are views showing configurations of laser modules. Referring to FIGS. 1A, 1B, 2A, and 2B, each of laser modules 1a, 1b, 1c, and 1d comprises a semiconductor optical amplifier device 3, an optical waveguide 5 such as an optical fiber, and a diffraction grating 7 such as a fiber grating. In addition, referring to FIG. 24, a laser module 1i comprises a semiconductor optical amplifier device 3, and a planar waveguide 5 having a diffraction grating 7. The semiconductor optical amplifier device 3 has a first end surface 3a and a second end surface 3b. The optical waveguide 5 is optically coupled to the semiconductor optical amplifier device 3. The diffraction grating 7 is optically coupled to the optical waveguide 5. A portion between the second end surface 3b of the semiconductor optical amplifier device 3 and the diffraction grating 7 constitutes an external cavity 9. An optical cavity length L of the external cavity 9 is set in a range of 13 millimeters or more but 27 millimeters or less. In a conventional laser module, an optical cavity length of an external cavity is set to about 6 mm. However, the length of the external cavitys 9 is formed longer in each of the above-described laser modules. Accordingly, deterioration in transmission caused by waveform distortion due to the group delay in multimode oscillation during mode hopping is suppressed, and these laser modules are usable as light sources regardless of the occurrence of mode hopping.

In the following, with reference to FIGS. 1A, 1B, 2A, and 2B, description will be made regarding the case of using a grating fiber having a diffraction grating as the optical waveguide 5. Referring to FIG. 1A, the laser module 1a comprises an external cavity 9a. The external cavity 9a includes the semiconductor optical amplifier device 3, the grating fiber 5, and a lens 11. The grating fiber 5 is an optical fiber having an end 5a and the diffraction grating 7 which is disposed at a predetermined distance away from the end 5a. The lens 11 optically couples the end 5a of the grating fiber 5 to the first end surface 3a of the semiconductor optical amplifier device 3. An optical cavity length La of the external cavity 9a is set in a range of 13 millimeters or more but 27 millimeters or less. The lens 11 can strengthen the optical coupling between the diffraction grating 7 and the semiconductor optical amplifier device 3.

Figure 1B:
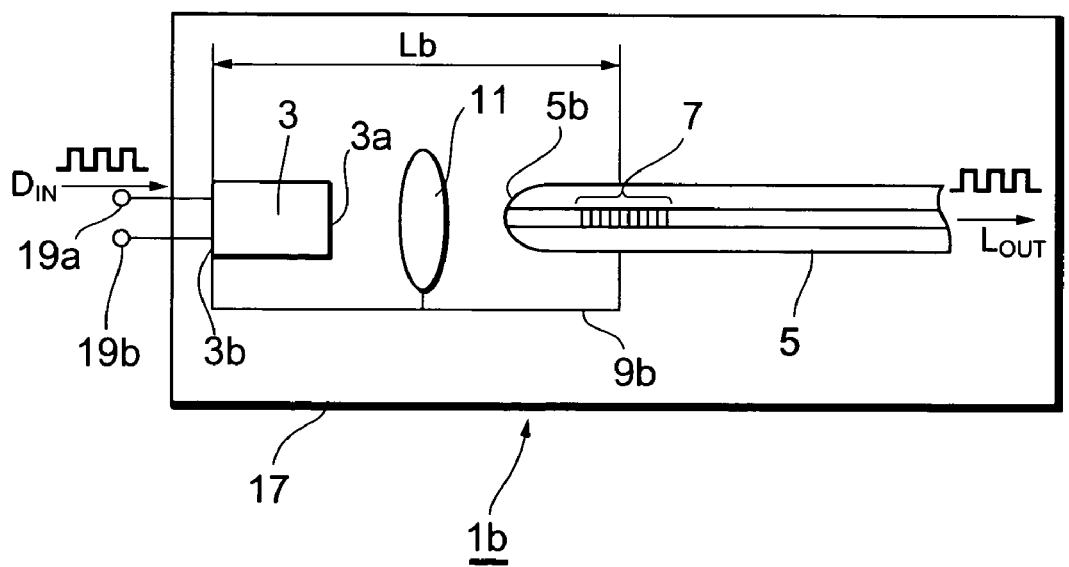

Referring to FIG. 1B, the laser module 1b comprises an external cavity 9b. The external cavity 9b includes the semiconductor optical amplifier device 3, the grating fiber 5, and a lens 11. The grating fiber 5 has an end 5b and the diffraction grating 7 which is disposed at a predetermined distance away from the end 5b. The end 5b includes a lens-shaped end portion. The lens 11 optically couples the end 5b of the grating fiber 5 to the first end surface 3a of the semiconductor optical amplifier device 3. An optical cavity length Lb of the external cavity 9b is set in a range of 13 millimeters or more but 27 millimeters or less. The lens-shaped end portion can further strengthen the optical coupling between the semiconductor optical amplifier device 3 and the grating fiber 5, and the characteristics of the fiber grating are thereby improved.

Each of the laser modules 1a and 1b comprises a housing 17. The housing 17 holds the semiconductor optical amplifier device 3, the grating fiber 5, and the lens 11.

Figure 2A:
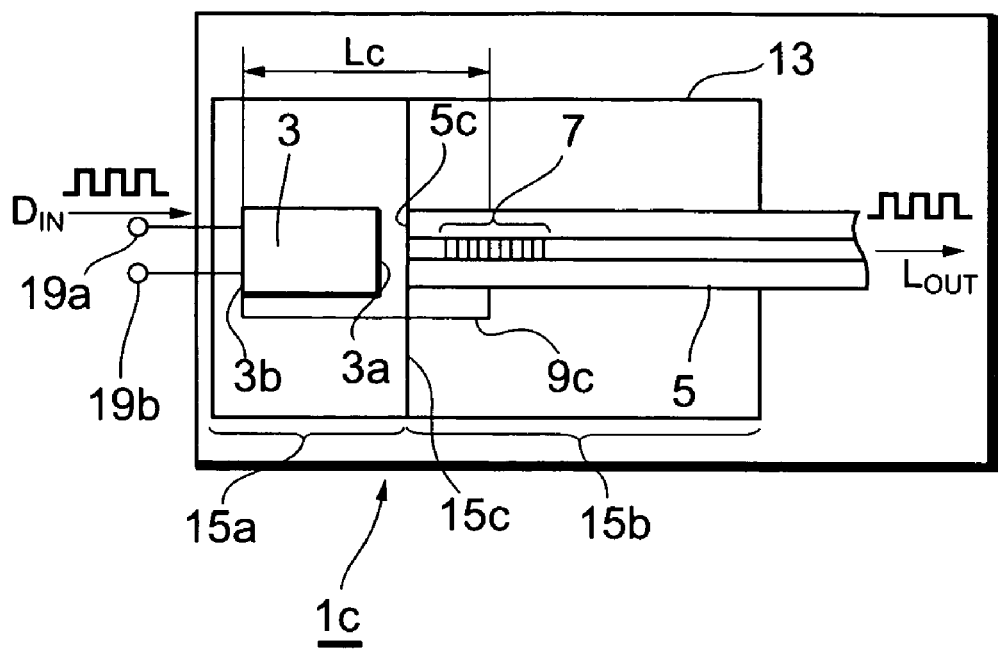
FIGS. 2A and 2B are views showing other configurations of laser modules.

Referring to FIG. 2A, the laser module 1c comprises a component-mounted member 13 for constituting an external cavity 9c. The external cavity 9c includes the semiconductor optical amplifier device 3 and the grating fiber 5. The component-mounted member 13 includes a first region 15a and a second region 15b. The first region 15a and the second region 15b are disposed along a predetermined axis. The first region 15a mounts the semiconductor optical amplifier device 3. The second region 15b includes an abutting surface 15c on which an end 5c of the grating fiber S is abutted. An optical cavity length Lc of the external cavity 9c is set in a range of 13 millimeters or more but 27 millimeters or less. The grating fiber 5 is positioned depending on the abutting surface 15c and optically coupled to the semiconductor optical amplifier device 3 by butt joint.

This structure does not require an independent lens. Accordingly, cost reduction can be achieved as compared with a configuration which required a lens. Moreover, since the semiconductor optical amplifier device 3 and the grating fiber 5 are the only components that constitute the cavity. Accordingly, an optical axis alignment operation in assembly of the laser module becomes easier, and improvement in productivity and cost reduction are thereby achieved.

Figure 2B:
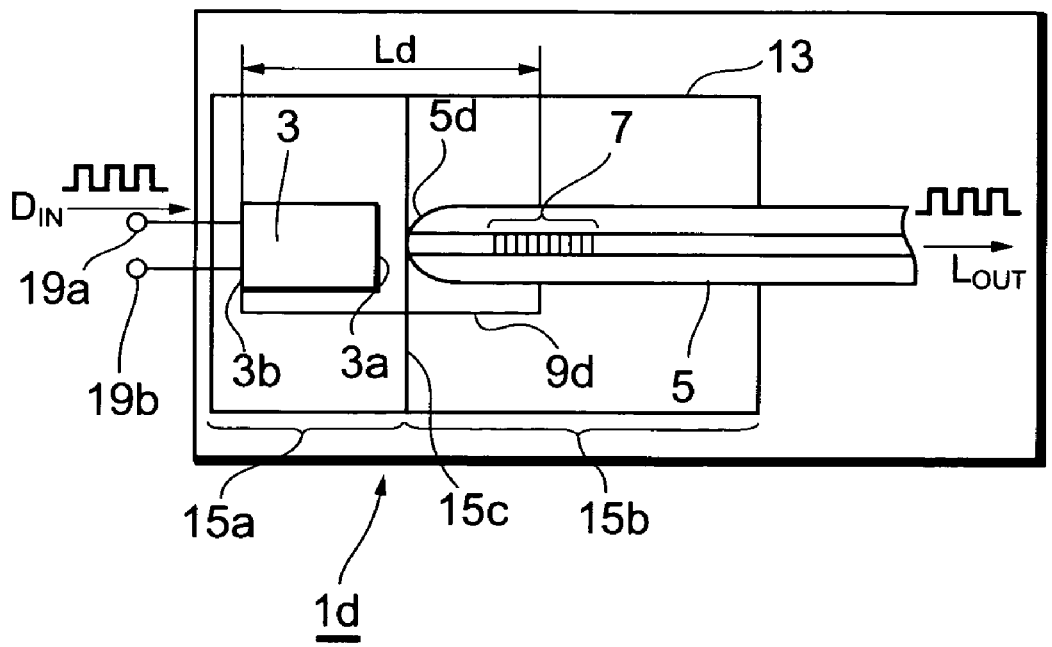

Referring to FIG. 2B, in the laser module 1d, an end of the grating fiber 5 may be a lens-shaped end portion 5d. An optical cavity length Ld of an external cavity 9d is set in a range of 13 millimeters or more but 27 millimeters or less. The lens-shaped end portion 5d can further strengthen the optical coupling between the semiconductor optical amplifier device 3 and the grating fiber 5, and the characteristics of the laser module are thereby improved.

With the component-mounted member 13 of the laser module 1c or 1d, the optical coupling of the grating fiber 5 to the semiconductor optical amplifier device 3 can be achieved by passive alignment. Each of the laser modules 1c and 1d has a butt joint structure.

Since a low-cost member such as silicon bench can be used as the component-mounted member 13 in the structure of the laser module 1c or 1d, it is possible to reduce material costs. Moreover, it is possible to mount the semiconductor optical amplifier device 3 and the grating fiber 5 with high precision by the passive alignment, by means of forming alignment markers, grooves for disposing the components, and the like on the component-mounted member 13 in advance. Accordingly, it becomes unnecessary to carry out optical axis alignment between the semiconductor optical amplifier device 3 and the grating fiber 5, which is accompanied by an optical axis alignment operation while causing the semiconductor optical amplifier device 3 to emit light. Thus, it is possible to save the time of mounting and thereby to reduce manufacturing costs. In this way, it is possible to achieve a reduction in the costs of the module.

Figure 24:
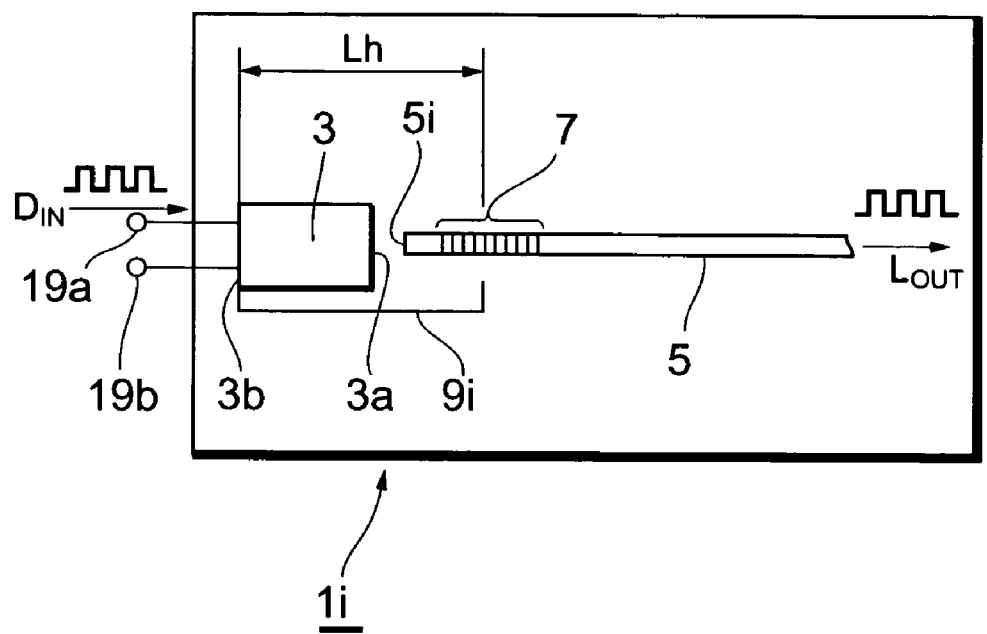
FIG. 24 is a view showing a configuration of another laser module.

Next, with reference to FIG. 24, description will be made regarding the case of using the planar waveguide having the diffraction grating 7, as the optical waveguide 5. Referring to FIG. 24, a laser module 1i includes an external cavity 9i. The external cavity 9i includes the semiconductor optical amplifier device 3 and the planar optical waveguide 5. The planar optical waveguide 5 is formed on a Si substrate, for example, and may essentially contain silica glass. The planar optical waveguide 5 has one end 5i and the diffraction grating 7 which is disposed at a predetermined distance away from the end 5i. An optical cavity length Lh of the external cavity 9i is set in a range of 13 millimeters or more but 27 millimeters or less.

In each of these laser modules 1a, 1b, 1c, 1d, and 1i, the semiconductor optical amplifier device 3 may further comprise a converting portion for converting a spot size of light emitted from the semiconductor optical amplifier device 3. The converting portion can convert the spot size of light emitted from the semiconductor optical amplifier device 3 and thereby further strengthen the optical coupling between the semiconductor optical amplifier device 3 and the grating fiber 5. Accordingly, the characteristics of the laser module are improved.

According to the laser module 1a, 1b, 1c, 1d, and 1i, it is possible to achieve long-distance transmission at a transmission rate of about 1 gigabits per second (Gbps) without performing temperature adjustment of the laser module.

In each of these laser modules 1a, 1b, 1c, 1d, and 1i, the semiconductor optical amplifier device 3 receives a transmission signal $DI_N$ through lead terminals 19a and 19b of the laser module. The laser module generates signal light $L_{OUT}$ in response to the transmission signal $D_{IN}$.

Figure 3:
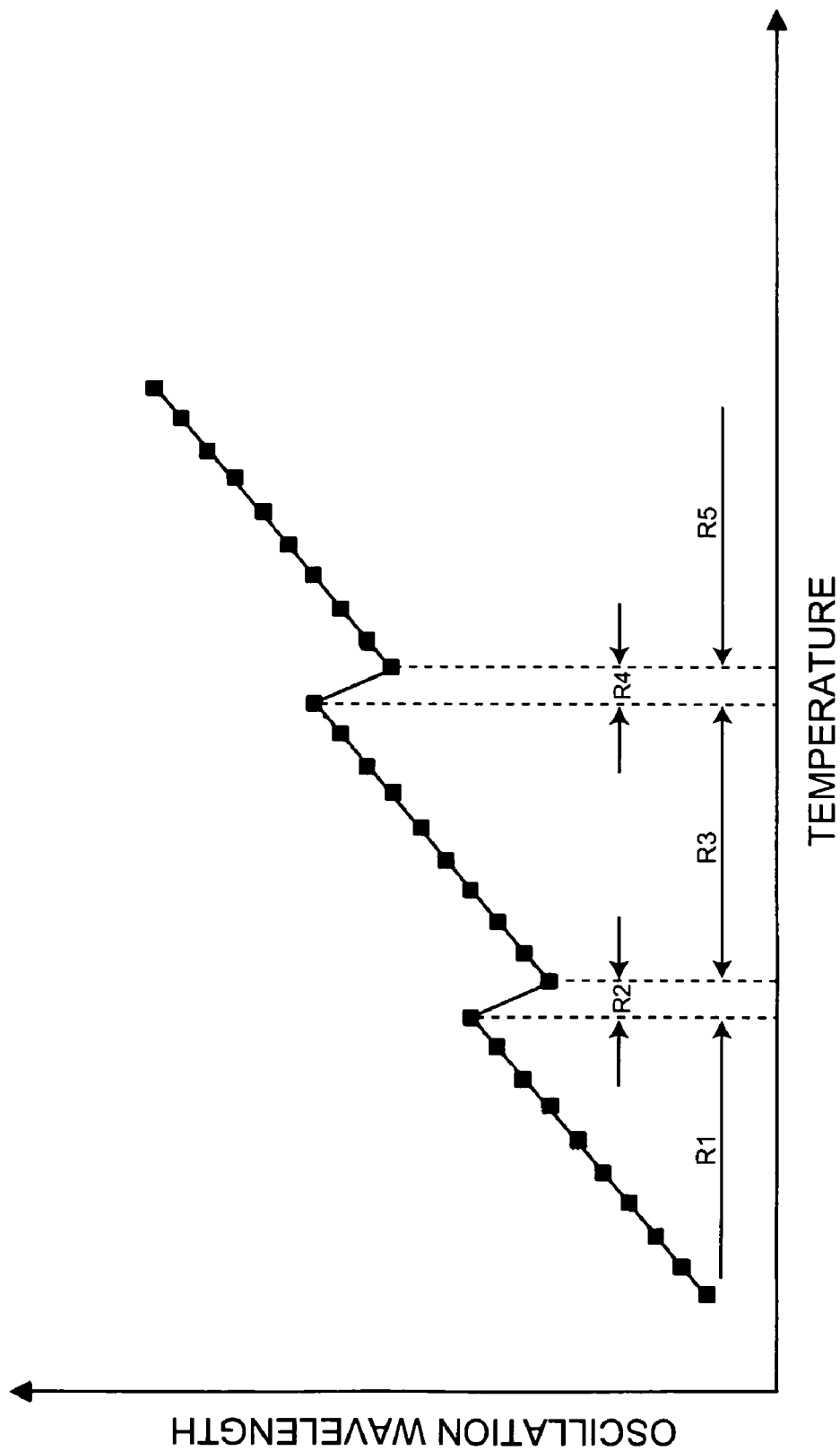
FIG. 3 is a graph showing a change in an oscillation wavelength of a laser module due to temperature.

FIG. 3 is a graph showing a change in an oscillation wavelength of a laser module due to temperature. In FIG. 3, a vertical axis indicates a wavelength of laser light and a horizontal axis indicates an ambient temperature of the laser module. Referring to FIG. 3, in a normal region R1, the laser module oscillates in an m-th longitudinal mode $M_1$. In a normal region R3, the laser module oscillates in an m+1-th longitudinal mode $M_2$. In a normal region R5, the laser module oscillates in an m+2-th longitudinal mode $M_3$. Concerning each of these longitudinal modes, the oscillation wavelength becomes longer as the temperature increases. There is a first mode hopping region R2 between the normal regions R1 and R3. There is a second mode hopping region R4 between the normal regions R3 and R5.

Figure 4A:
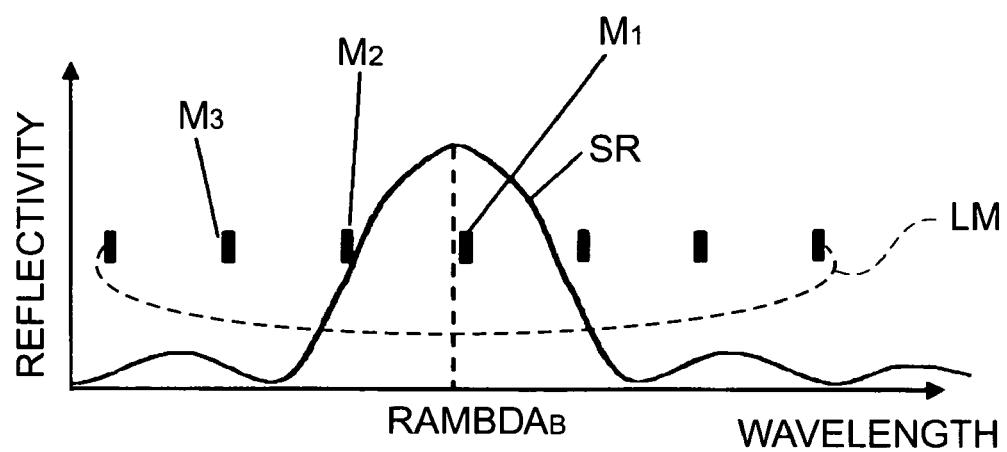
FIGS. 4A and 4B are views showing reflection spectra exhibited by a diffraction grating of a laser module, and longitudinal modes of the laser module.
Figure 4B:
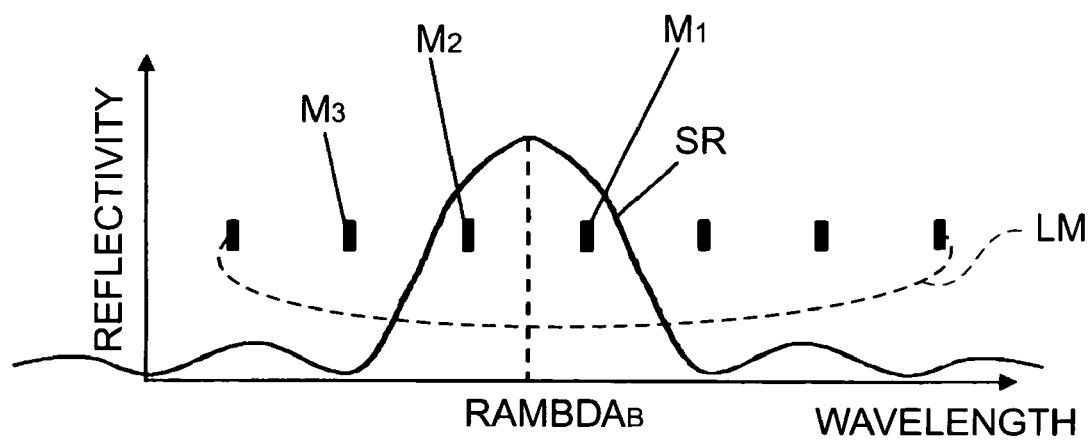
Figure 5A:
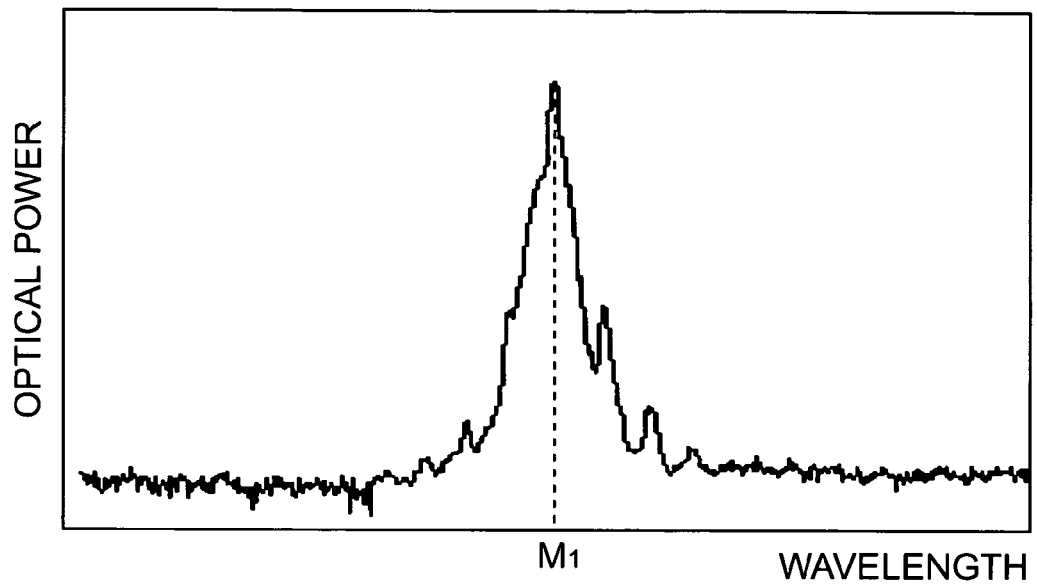
FIG. 5A is a view showing an oscillation spectrum of a laser module operating in a normal region.
Figure 5B:
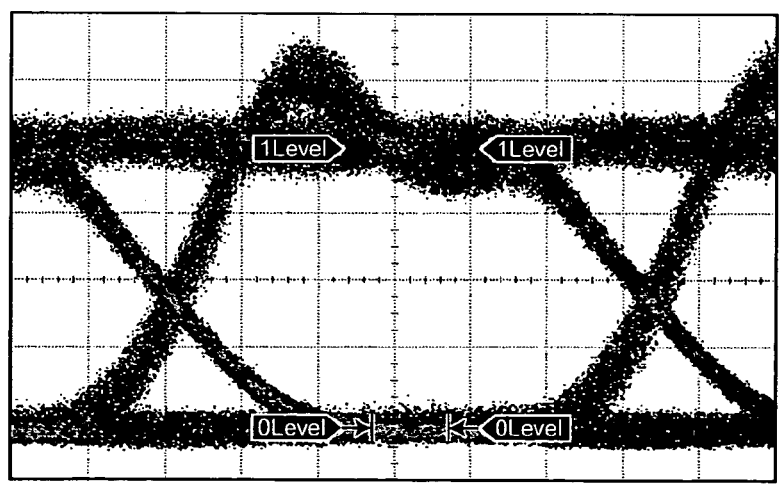
FIG. 5B is a view showing an eye pattern of optical transmission using the laser module operating in the normal region.
Figure 6A:
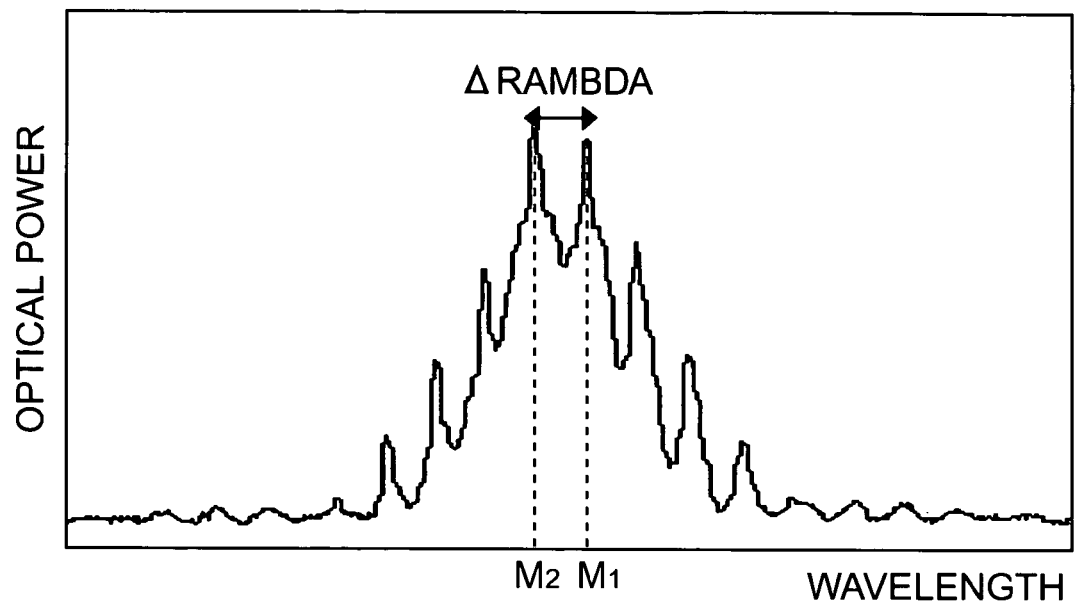
FIG. 6A is a view showing an oscillation spectrum of the laser module operating in a mode hopping region.
Figure 6B:
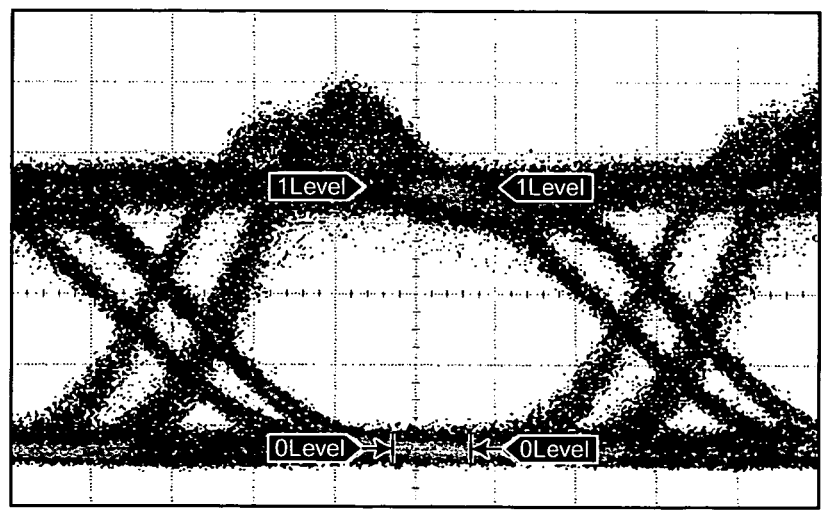
FIG. 6B is a view showing an eye pattern of optical transmission using the laser module operating in the mode hopping region.

FIGS. 4A and 4B are views showing relations between reflection spectra presented by the diffraction grating of the laser module, and the longitudinal modes of the laser module in the normal region R1 and in the mode hopping region R2, respectively. In each of FIGS. 4A and 4B, a horizontal axis indicates a wavelength and a vertical axis indicates refrectivity of the diffraction grating. A reflection spectrum SR and a longitudinal mode line LM are shown in each of FIGS. 4A and 4B. FIG. 5A is a view showing an oscillation spectrum of a laser module operating in the normal region R1. FIG. 5B is a view showing an eye pattern of optical transmission after optical transmission was performed using the laser module operating in the normal region R1. In FIG. 5A, a vertical axis indicates power, and a horizontal axis indicates the wavelength. FIG. 6A is a view showing an oscillation spectrum of the laser module operating in the mode hopping region R2. FIG. 6B is a view showing an eye pattern after optical transmission was performed using the laser module operating in the mode hopping region R2. In FIG. 6A, a vertical axis indicates the power, and a horizontal axis indicates the wavelength.

In the normal region R1, only the m-th longitudinal mode $M_1$ is located in the vicinity of the Bragg wavelength as shown in FIG. 4A. Accordingly, the m-th longitudinal mode $M_1$ oscillates in a single mode as shown in FIG. 5A. Therefore, no group delay distortion of an optical pulse caused by wavelength dispersion of an optical transmission line occurs. As a result, an eye pattern without jitter components is obtained as shown in FIG. 5B. In this optical transmission, there is no deterioration in transmission attributable to the group delay distortion.

Next, consideration is made regarding the case where the ambient temperature is increased to a temperature in the mode hopping region R2. A line of the longitudinal mode wavelengths of the laser module and the Bragg wavelength of the reflection spectrum of the diffraction grating are shifted to a longer wavelength side when the temperature is increased. However, a rate of change in the longitudinal mode due to temperature is greater than a rate of change in the Bragg wavelength due to temperature. Accordingly, a shift of the longitudinal mode is larger than a shift of the Bragg wavelength with respect to a change of certain magnitude in temperature. For this reason, the m-th longitudinal mode $M_1$ of which laser oscillation is being performed is relatively separated from the Bragg wavelength along with the temperature increase as shown in FIG. 4B. Accordingly, the reflectivity to be obtained from the diffraction grating is reduced and the laser oscillation becomes difficult. Meanwhile, the m+1-th longitudinal mode $M_2$, which is adjacent to the m-th longitudinal mode $M_1$ on the shorter wavelength side, approaches the Bragg wavelength along with the temperature increase. Therefore, the reflectivity to be obtained from the diffraction grating is increased and the laser oscillation becomes easier. As a result, the longitudinal mode for oscillation is switched from the mode $M_1$ to the mode $M_2$ at a certain temperature increase. This is referred to as a mode hopping phenomenon.

In the temperature range where the mode hopping phenomenon is triggered, the mode which has oscillated dominantly in the single mode is weakened, and a plurality of longitudinal modes existing in the full width at half maximum of the reflection spectrum of the diffraction grating comes in mode competition with one another. Accordingly, the laser module oscillates in multimode. FIG. 6A shows an oscillation spectrum of the laser module which oscillates in multimode in the mode hopping region R2. The primary longitudinal modes $M_1$ and $M_2$ are mainly oscillating. A symbol ΔRAMBDA denotes a wavelength difference between the longitudinal mode $M_1$ and the longitudinal mode $M_2$. The longer an optical cavity length is, the smaller this wavelength difference becomes. The optical cavity length is the sum of values obtained by multiplying physical lengths of regions with different refractive indexs inside a cavity by the respective refractive indexs, and is an effective cavity length to be sensed by light. FIG. 6B shows an eye pattern after optical transmission using signal light which oscillates in multimode in the mode hopping region R2. In this eye pattern, jitters caused by transmission delay between the modes $M_1$ and $M_2$ appear at a leading edge and a trailing edge thereof. In other words, group delay distortion occurs in a waveform of a transmission optical pulse in this optical transmission. However, if an interval between the adjacent longitudinal modes is small, waveform distortion caused by the transmission delay between the longitudinal modes is reduced. In the laser module of this embodiment, the cavity length is set in the range of 13 millimeters or more but 27 millimeters or less, and the wavelength difference ΔRAMBDA is 90 picometers or below in an optical communication wavelength region of 1.55 micrometers. Hence the waveform distortion of the signal light is sufficiently small even in the temperature region where the mode hopping occurs.

In the laser module, an upper limit frequency that can be modulated is reduced when the cavity length is increased. Therefore, prior to the present invention, an attempt to use a laser module having a relatively long cavity length has not been carried out. In this embodiment, it is possible to reduce the interval between the oscillation modes in the multimode oscillation during the mode hopping by increasing the cavity length, and the transmission delay between these oscillation modes is thereby reduced. Hence, the waveform distortion caused by the transmission delay is also reduced during the mode hopping.

Figure 7:
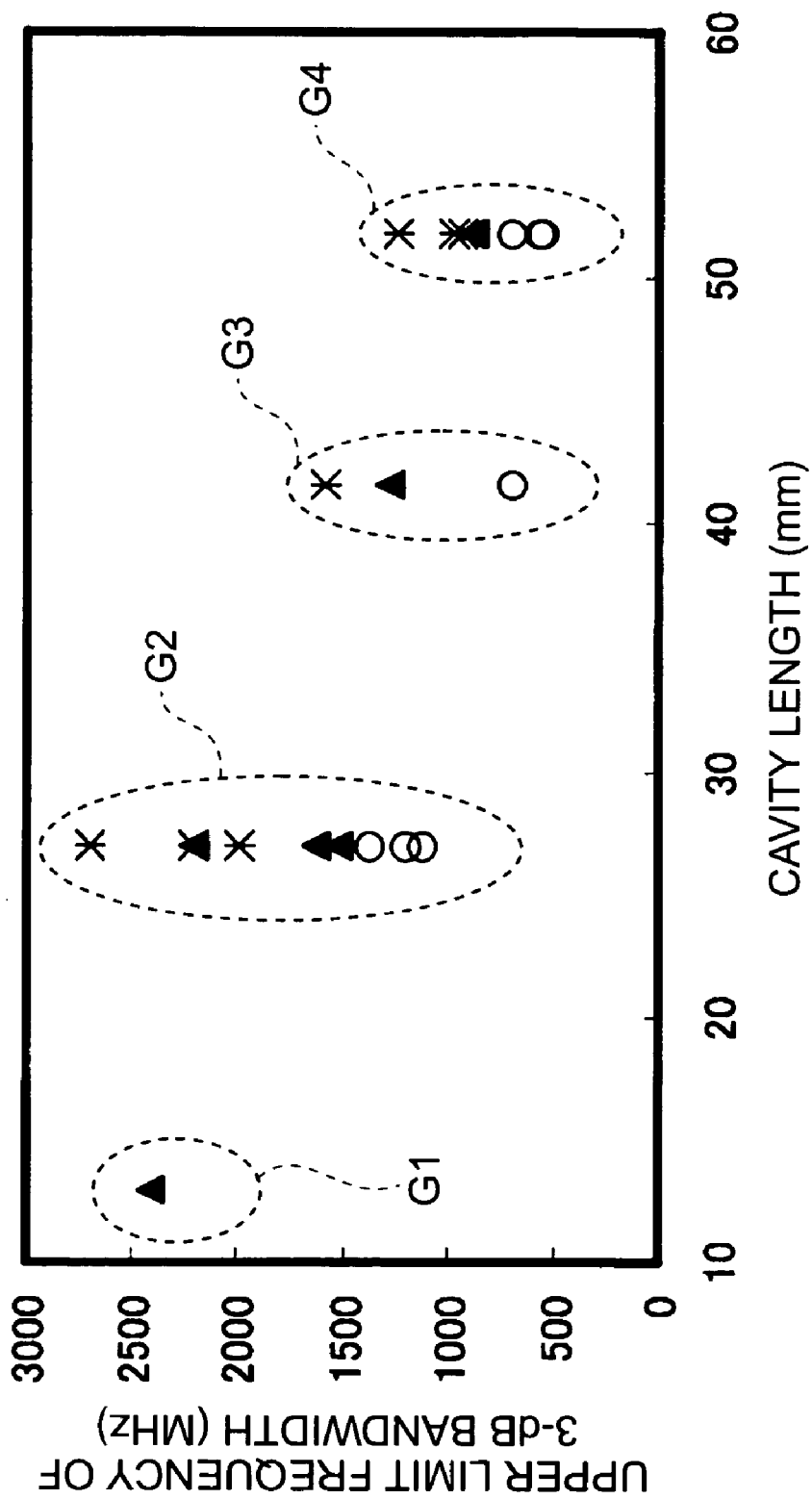
FIG. 7 is a graph showing frequency response characteristics of laser modules having various optical cavity lengths.

FIG. 7 is a graph showing frequency response characteristics of laser modules having various optical cavity lengths. A horizontal axis indicates the cavity length (unit: millimeters) and a vertical axis indicates the frequency response (unit: megahertz). The frequency response indicates an upper limit frequency in a 3-decibel bandwidth. In the graph, symbols "○", "▲", and "*" indicate characteristics of the laser modules with direct bias currents of 20 milliamperes, 30 milliamperes, and 40 milliamperes, respectively. Groups G1, G2, G3, and G4 indicate measurement values of the laser modules having the cavity lengths of 13 millimeters, 27 millimeters, 41.6 millimeters, and 51.8 millimeters, respectively.

Referring to FIG. 7, modulation is possible at a frequency of 1.25 gigabits per second (Gbps) when the cavity length is 27 millimeters and the bias current is 20 milliamperes or above. As a result of detailed experiments, this laser module turned out to be capable of achieving the optical transmission at 1.25 gigabits per second (Gbps) over an 80-kilometer (km) optical transmission line constituted by a silica-type optical fiber. In the case of the cavity length of 27 millimeters, the longitudinal mode interval is equal to or less than 50 picometers in an optical communication wavelength region of 1.55 micrometers. Accordingly, a transmission delay between the adjacent longitudinal modes is small. Therefore, distortion of transmission waveform caused by the group delay distortion is considerably reduced even in the mode hopping region, and fine transmission characteristics can be obtained. A power penalty in a bit error rate (BER) characteristic of 80-kilometer transmission is 1 decibel (1 dB) or below relative to a back-to-back transmission when BER is $10^{-10}$. This value is practically acceptable.

When the optical cavity length is set shorter than 27 millimeters, an upper limit frequency of transmission becomes higher. However, since the interval between the longitudinal modes becomes wider, the transmission delay between the adjacent longitudinal modes becomes larger. As a result of detailed experiments in the case of modulation at 1.25 Gbps, in the 1.55-micrometer region, the interval between the adjacent longitudinal modes was 90 picometers or below if the optical cavity length is 13 millimeters or above, and it was found that deterioration in the transmission waveform caused by the group delay distortion did not occur significantly when the mode interval was set in the above range or below. As a consequence, the optical transmission at 1.25 gigabits per second over a 40-kilometer optical transmission line constituted by a silica-type optical fiber is achieved by use of the laser module having the cavity length of 13 millimeters or above.

According to the above-described results of the experiments, if the optical cavity length is set in the range of 13 millimeters or more but the 27 millimeters or less, signal transmission over 40 kilometers at 1.25 gigabits per second is achieved including a mode hopping region. Therefore, the non-temperature controlled type (uncooled) laser module is applicable to an optical transmission system as mentioned above.

Moreover, according to the results of the experiment shown in FIG. 7, if the optical cavity length is set in a range of 13 millimeters or more to 51.8 millimeters or less, a laser module is provided, which is usable in an non-temperature controlled state at a modulation rate of 500 MHz or above including a mode hopping region. The measurement values of the longitudinal mode intervals in the groups G1, G2, G3, and G4 in the 1.55-micrometer wavelength region are 90 picometers, 45 picometers, 29 picometers, and 23 picometers, respectively.

In a preferred embodiment, the interval between the adjacent longitudinal modes in the external cavity may be set to a value within the full width at half maximum of the reflection spectrum of the diffraction grating. According to this laser module, a plurality of longitudinal modes exists in the full width at half maximum of the reflection spectrum of the diffraction grating in the mode hopping region. Therefore, the plurality of modes oscillates simultaneously during the mode hopping and the oscillation shifts smoothly to the adjacent mode. In this way, it is possible to suppress output variation during the mode hopping.

Moreover, in another preferred embodiment, the full width at half maximum of the reflection spectrum of the diffraction grating may be set to 0.4 nanometer or below. According to this reflection spectrum, as compared with reflectivities of two longitudinal modes in the vicinity of the Bragg wavelength, reflectivities at wavelengths of longitudinal modes other than the foregoing two longitudinal modes becomes smaller. For this reason, with this full width at half maximum, the laser oscillations in the longitudinal modes other than the two longitudinal modes in the vicinity of the Bragg wavelength (primary modes) are suppressed and reduced by 10 decibels (dB) or above as compared with the primary modes, thus becoming an ignorable level. That is, the wavelength components in the other modes do not contribute to the optical transmission of the signal. In other words, by using the diffraction grating with the full width at half maximum of 0.4 nanometer or below, two-mode oscillation is established in the mode hopping region, and the multimode oscillation in excess of two modes is thereby suppressed. Therefore, it is possible to suppress the occurrence of signal light having the wavelength components in multimode in excess of two modes in the laser module. Moreover, it is possible to prevent an increase in group delay distortion caused by the wavelength components in multimode in excess of the two modes. In this way, deterioration in transmission is further reduced.

In each of the laser modules 1a, 1b, 1c, 1d, and 1i, the semiconductor optical amplifier device 3 receives the transmission signal $DI_N$ through the lead terminals 19a and 19b of the relevant laser module. The laser module generates the signal light $LO_{UT}$ in response to the transmission signal $D_{IN}$. A method of generating an optical signal by use of any of the laser modules 1a, 1b, 1c, 1d, and 1i takes the following procedures. This method includes a step of generating laser signal light containing first and second wavelength components corresponding to two adjacent longitudinal modes from a laser module by applying an electric signal to the laser module when an ambient temperature of the laser module is a mode hopping temperature, and a step of generating laser signal light corresponding to a single longitudinal mode from the laser module by applying an electric signal to the laser module when the ambient temperature of the laser module is different from the mode hopping temperature. Here, an interval between the first wavelength component and the second wavelength component is 90 picometers or below.

The longitudinal mode of the optical cavity of the laser module changes in accordance with the temperature, and in the laser module, mode hopping occurs at one mode hopping temperature at least. However, in this method, the interval between the first wavelength component and the second wavelength component is 90 picometers or below. Accordingly, distortion of the optical signal due to the group delay distortion caused by the first and second wavelength components is small. Therefore, fine transmission is maintained even in the mode hopping region.

Second Embodiment

Figure 8:
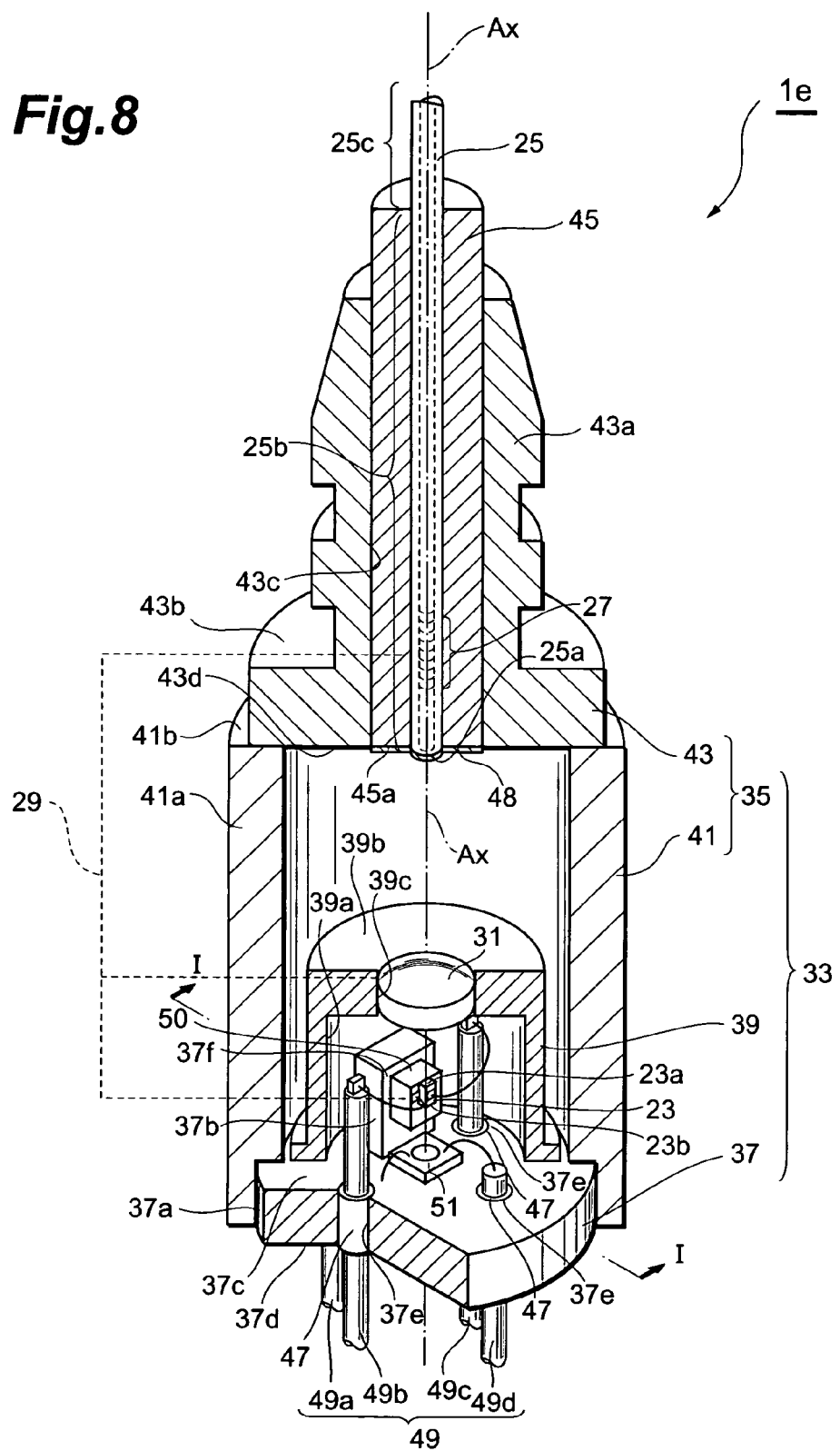
FIG. 8 is a perspective view showing a laser module according to a second embodiment.
Figure 9:
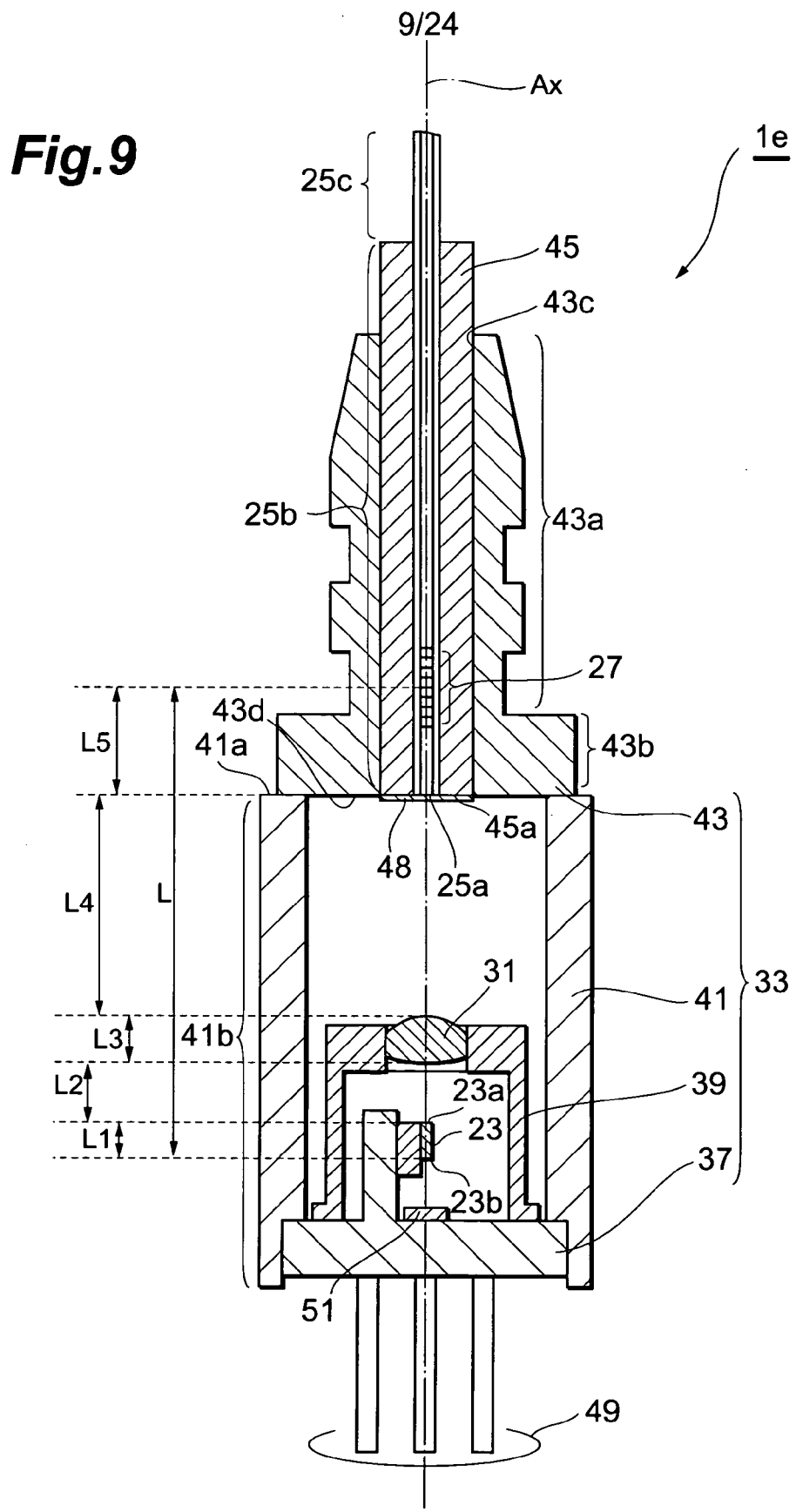
FIG. 9 is a cross-sectional view of the laser module taken along the I—I line in FIG. 8.

FIG. 8 is a perspective view showing a laser module according to a second embodiment. This module is a coaxial laser module of a pigtail type. FIG. 9 is a cross-sectional view of the laser module taken along the I—I line in FIG. 8.

Referring to FIGS. 8 and 9, a laser module 1e includes a semiconductor optical amplifier device 23, a grating fiber 25, and a lens 31. The grating fiber 25 has an end surface 25a and a diffraction grating 27 which is disposed at a predetermined distance away from the end surface 25a. The lens 31 optically couples the end surface 25a of the grating fiber 25 to a first end surface 23a of the semiconductor optical amplifier device 23. The semiconductor optical amplifier device 23, the grating fiber 25, and the lens 31 constitute an external cavity 29. The semiconductor optical amplifier device 23, the grating fiber 25, and the lens 31 are held by a housing 33. In this way, the laser module 1e is configured such that an optical cavity length L of the external cavity 29 is set in a range of 13 millimeters or more but 27 millimeters or less. Since the length of the external cavity 29 is longer than that of a conventional one, deterioration in transmission due to waveform distortion caused by group delay in multimode oscillation during mode hopping is suppressed. Accordingly, the laser module 1e can be used as a light source regardless of the occurrence of mode hopping.

Moreover, the laser module 1e may further include a mounting component 37, a lens holding member 39, a ferrule 45, and a ferrule holding member 35. The lens holding member 39 holds the lens 31. The ferrule 45 is provided above the mounting component 37 and holds the grating fiber 25. The ferrule holding member 35 holds the ferrule 45. The grating fiber 25 includes a first portion 25b including the diffraction grating 27, and a second portion 25c of a pigtail shape.

This laser module 1e is suitable for configuring a laser module having a relatively long cavity length.

The housing 33 comprises the ferrule holding member 35, the mounting component 37 such as a can package, and the lens holding member 39 such as a lens cap. The ferrule holding member 35 is mounted on the mounting component 37.

The ferrule holding member 35 comprises a sleeve 41 and a ferrule holder 43. The ferrule holder 43 holds the ferrule 45, and this ferrule 45 holds the grating fiber 25. The ferrule holder 43 holds the ferrule 45 such that the first portion 25b of the grating fiber 25 extends in a direction of a predetermined axis Ax.

The mounting component 37 includes a base 37a extending along a predetermined reference plane, and a mounting portion 37b provided on the base 37a. A first surface 37c is located on an opposite side to a second surface 37d. The mounting portion 37b includes a mounting surface 37f which extends along another reference plane intersecting the first surface 37c of the base 37a. The base 37a has several through holes 37e therein extending from the first surface 37c to the second surface 37d, and lead terminals 49a to 49d pass through the respective through holes 37e. A glass member 47 is provided between each of the lead terminals 49b to 49d and the base 37a. The glass members 47 insulate the lead terminals 49b to 49d from the base 37a and hermetically seal spaces between the lead terminals 49b to 49d and the base 37a. The semiconductor optical amplifier device 23 is supported by the mounting surface 37f of the mounting portion 37b via a mounting component 50 such as a submount.

The lens holding member 39 is placed on the mounting component 37. The lens holding member 39 includes a sidewall portion 39a extending in the direction of the predetermined axis Ax, and a ceiling potion 39b for holding the lens. The ceiling portion 39b is provided at one end of the sidewall portion 39a. The lens 31 is disposed at an opening 39c provided on the ceiling portion 39b. The other end of the sidewall portion 39a is positioned on the first surface 37c of the mounting component 37.

A monitoring semiconductor photodetector 51 is mounted on the mounting component 37. The semiconductor photodetector 51 is optically coupled to an end surface 23b of the semiconductor optical amplifier device 23 and monitors the light from the semiconductor optical amplifier device 23.

The sleeve 41 is positioned on the mounting component 37. The sleeve 41 includes a sidewall portion 41a extending in the direction of the predetermined axis Ax and a supporting surface 41b for supporting the ferrule holder 43. The supporting surface 41b is provided at one end of the sidewall portion 41a. The supporting surface 41b extends along a plane intersecting the predetermined axis Ax. The other end of the sidewall portion 41a is positioned on the first surface 37c of the mounting component 37. The length of the sidewall portion 41a of the sleeve 41 is longer than the length of the sidewall portion 39a of the lens holding member 39.

The ferrule holder 43 is disposed on the sleeve 41. The ferrule holder 43 includes a sidewall portion 43a extending in the direction of the predetermined axis Ax and a flange portion 43b for positioning itself relative to the sleeve 41. The sidewall portion 43a includes an inner side surface 43c for defining a region for inserting the ferrule 45. The flange portion 43b includes a sliding surface 43d for positioning the ferrule holder 43 on the supporting surface 41b.

By use of the above-described components, the low-cost and highly reliable laser module 1e of the pigtail type is provided.

In this laser module 1e, as shown in FIG. 9, the optical cavity length L is given as the sum of an optical length L1 of the semiconductor optical amplifier, an optical length L2 between the semiconductor optical amplifier and the lens, an optical length L3 of the lens, an optical length L4 between the lens and one end of the grating fiber, and an optical length L5 between the one end of the grating fiber and the diffraction grating.

In the laser module as described above, the can package includes a lead pin, for example. The semiconductor optical amplifier device is die bonded onto the submount with Au—Sn eutectic solder. The submount is die bonded onto the can package with Au—Sn eutectic solder. The monitoring semiconductor photodetector is die bonded onto the can package with Au—Sn eutectic solder. One end surface of the semiconductor optical amplifier device is provided with an AR coating film, and the other end surface thereof is provided with an HR coating film. The AR-coated one end surface of the semiconductor optical amplifier device is optically coupled to the lens. The semiconductor optical amplifier device and the monitoring semiconductor photodetector are connected to the lead pin via a bonding wire.

Moreover, in a preferred embodiment, as shown in FIGS. 8 and 9, the laser module 1e may include an anti-reflection film 48 provided on one end surface 45a of the ferrule 45 and the end surface 25a of the grating fiber 25. In this case, it is possible to effectively suppress reflected light from the end surface 45a of the ferrule 45 and from the end surface 25a of the grating fiber 25 to the semiconductor optical amplifier device 23. Thus, an oscillation state of the fiber grating laser is more stabilized.

Figure 10:
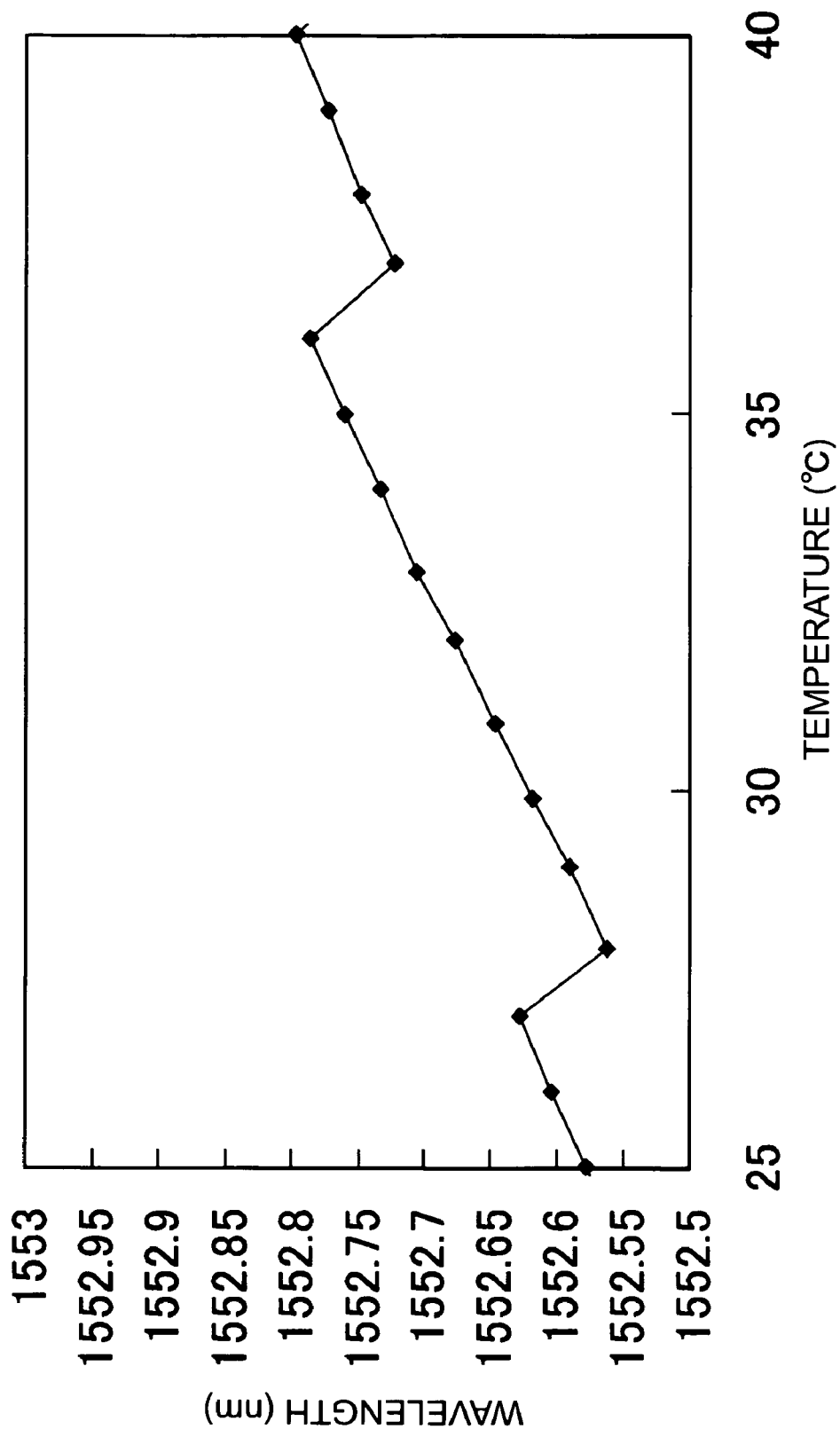
FIG. 10 is a graph showing a temperature characteristic of an oscillation wavelength of the laser module.

FIG. 10 is a graph showing a temperature characteristic of an oscillation wavelength of the laser module. The Bragg wavelength, peak reflectivity, and a reflection bandwidth (the full width at half maximum) of this fiber grating are 1552.54 nanometers, 28 percent, and 0.4 nanometer, respectively. The dimensions L1 to L5 of the respective portions of the laser module are set to 1.11, 1.11, 2.43, 6.54, and 2.15 millimeters, respectively, and the optical cavity length L is 13.34 millimeters. The longitudinal mode interval ΔRAMBDA is given as the following formula.

$$(RAMBDA_{OC} \times RAMBDA_{OC})/2L$$

Here, $RAMBDA_{OC}$ denotes the oscillation wavelength. The oscillation wavelength is almost equal to the Bragg wavelength of the fiber grating. Accordingly, it is calculated from the above formula that the longitudinal mode interval is about 90 picometers.

The temperature characteristic of the oscillation wavelength of this laser module is measured. Conditions of laser modulation are as follows: a transmission rate at 1.25 gigabits per second; and modulation at an extinction ratio of 10 dB by an NRZ signal of PRBS $2^{23}-1$. The result is shown in FIG. 10.

Referring to FIG. 10, mode hopping occurs in the vicinity of a temperature of 28 degrees centigrade and in the vicinity of a temperature of 37 degrees centigrade. A rate of change in the oscillation wavelength due to temperature is 28 picometers per degree in the normal region. On the other hand, ambient temperature dependency of the oscillation wavelength of a semiconductor laser of which the temperature is controlled by a peltier element is far smaller than the foregoing.

Next, the transmission characteristic of this laser before and after the mode hopping in the vicinity of 28 degrees centigrade was evaluated. The laser was modulated at an extinction ratio of 10 decibels (dB) by use of an NRZ signal of PRBS $2^{23}-1$ with a transmission rate of 1.25 gigabits per second. The result is shown in FIGS. 11A to 14C.

Figure 11A:
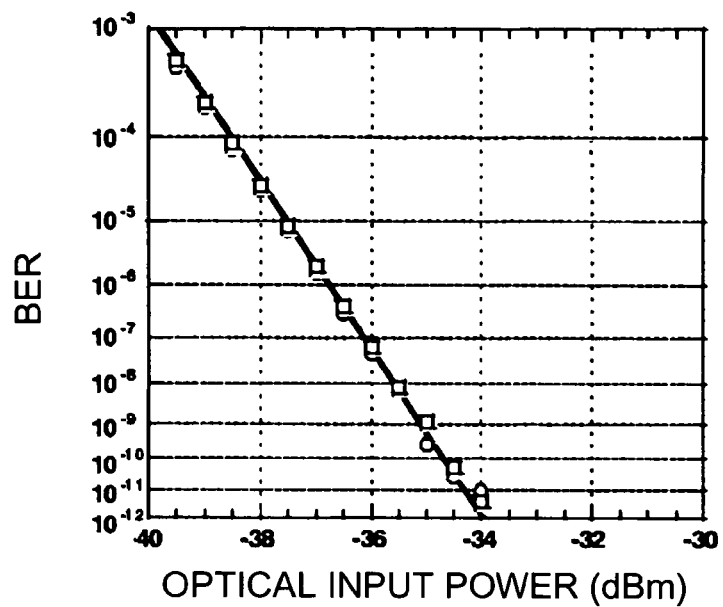
FIG. 11A to 11C are views showing a bit error rate, an oscillation spectrum, and an eye pattern, respectively.
Figure 11B:
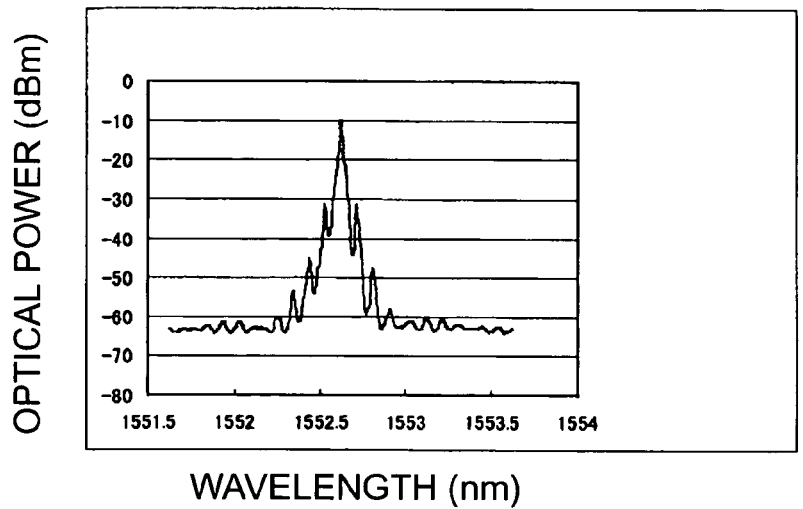
Figure 11C:
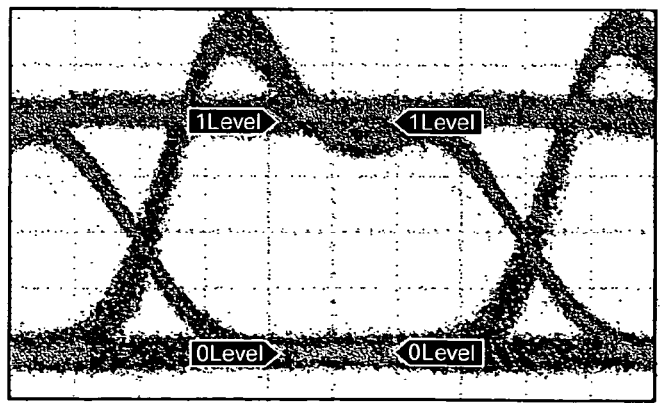

FIGS. 11A to 11C are views showing a bit error rate, an oscillation spectrum, and an eye pattern after transmission over 40 kilometers, respectively, in the normal region before reaching the mode hopping region. These characteristics were measured at a temperature of 27.8 degrees centigrade. Referring to FIG. 11A, a power penalty is at a practically acceptable level according to a difference between the transmission over 40 kilometers (the symbol □) and back-to-back transmission (symbol ○). Referring to FIG. 11B, a single longitudinal mode oscillates at this temperature. As compared with the maximum peak of this oscillation spectrum, an adjacent peak value is smaller by about 20 dB. Referring to FIG. 11C, jitters are hardly observed.

Figure 12A:
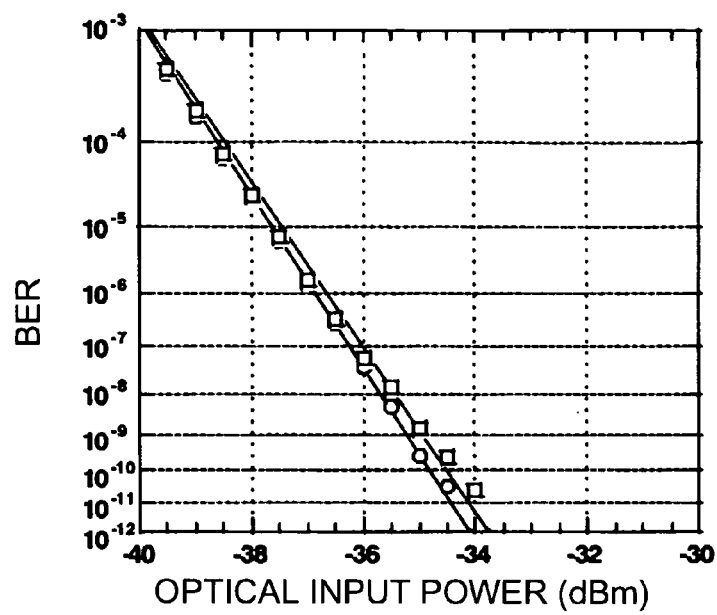
FIGS. 12A to 12C are other views showing a bit error rate, an oscillation spectrum, and an eye pattern, respectively.
Figure 12B:
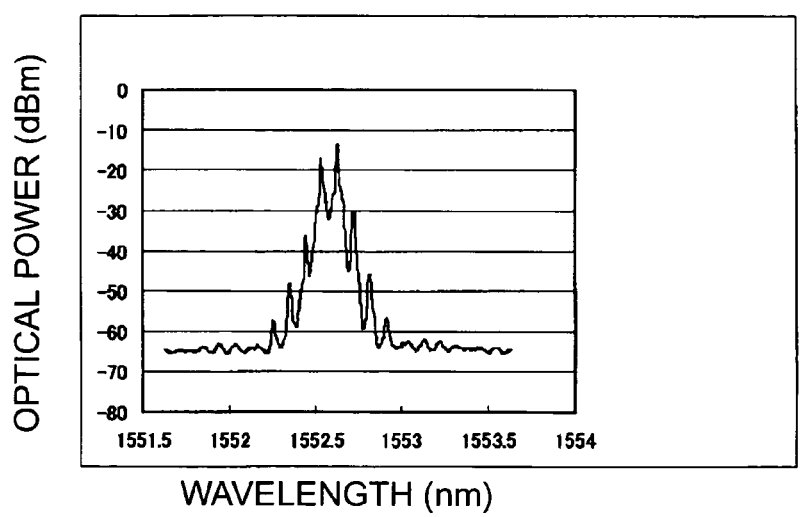
Figure 12C:
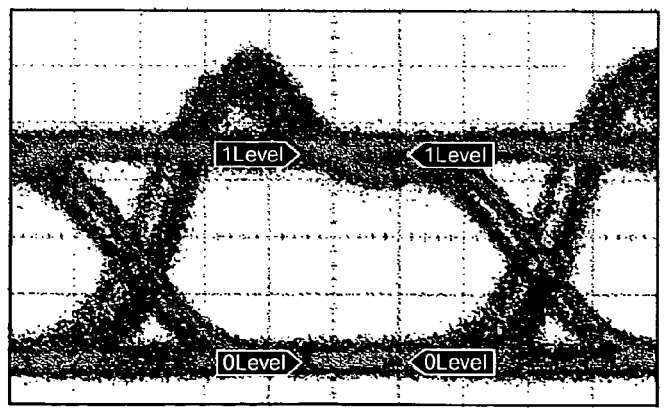
Figure 13A:
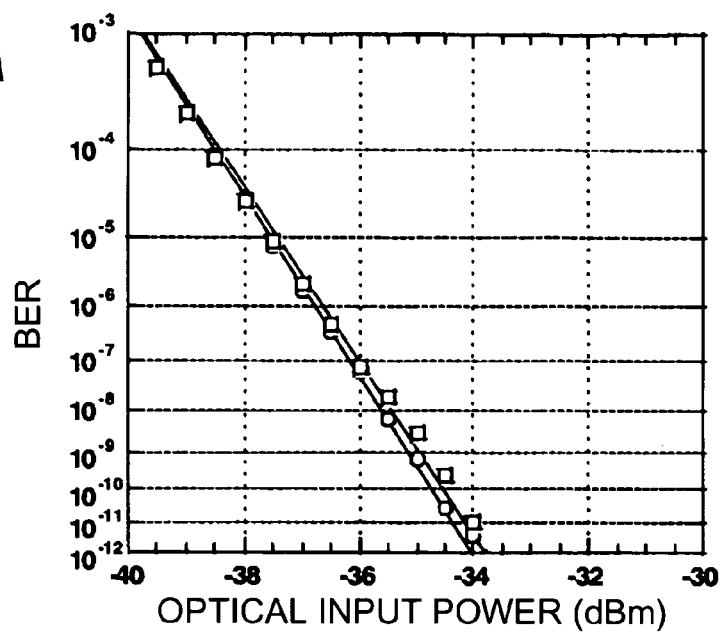
FIGS. 13A to 13C are other views showing a bit error rate, an oscillation spectrum, and an eye pattern, respectively.
Figure 13B:
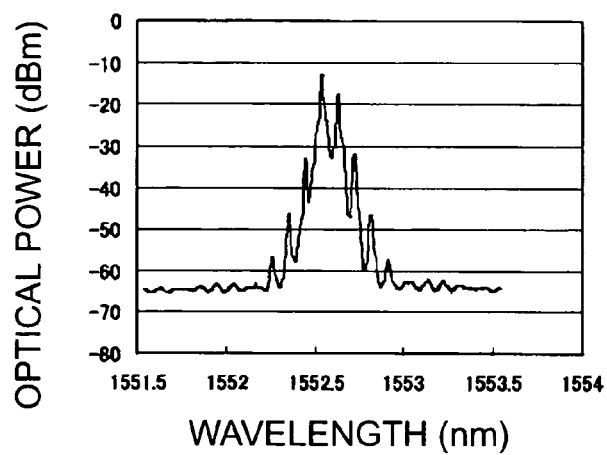
Figure 13C:
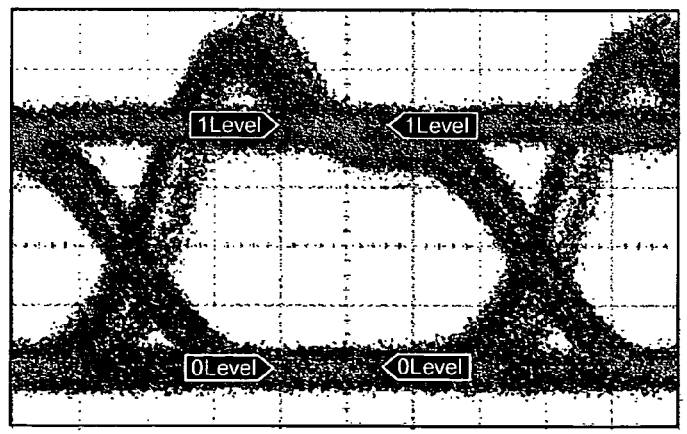

The mode hopping region begins when the ambient temperature is increased above 27.8 degrees centigrade. FIGS. 12A to 12C and FIGS. 13A to 13C are views showing bit error rates, oscillation spectra, and eye patterns after transmission of 40 kilometers, each in the vicinity of the occurrence of the mode hopping. The characteristics in FIGS. 12A to 12C were measured at a temperature of 28.1 degrees centigrade. The characteristics in FIGS. 13A to 13C were measured at a temperature of 28.2 degrees centigrade. Referring to FIGS. 12B and 13B, at each of these temperatures, two longitudinal modes oscillate with a mode interval of about 90 picometers which is equal to the calculated value. Of these modes, the mode on the longer wavelength side is the mode which has been oscillated before the mode hopping, and the mode on the shorter wavelength side is the mode which serves as a main part of oscillation after the mode hopping. As compared with the maximum peak of the oscillation spectrum, an adjacent peak value is smaller by 3 to 4 decibels (dB) or thereabouts. When the ambient temperature changed from 28.1 degrees centigrade to 28.2 degrees centigrade, the intensity of longitudinal mode on the shorter wavelength side is increased, and the main part of the longitudinal mode for oscillation is switched to the longitudinal mode on the shorter wavelength side. In other words, the mode hopping occurs at this point. Referring to FIGS. 12C and 13C, although jitters are observed, clear waveform distortion is not generated in each case. Referring to FIGS. 12A and 13A, concerning the bit error rate, the power penalty is 1 decibel or below at a BER value of $10^{-10}$, which is at a practically acceptable level. That is, fine transmission characteristics are achieved even in the mode hopping region where the transmission characteristics are supposed to be the worst.

Figure 14A:
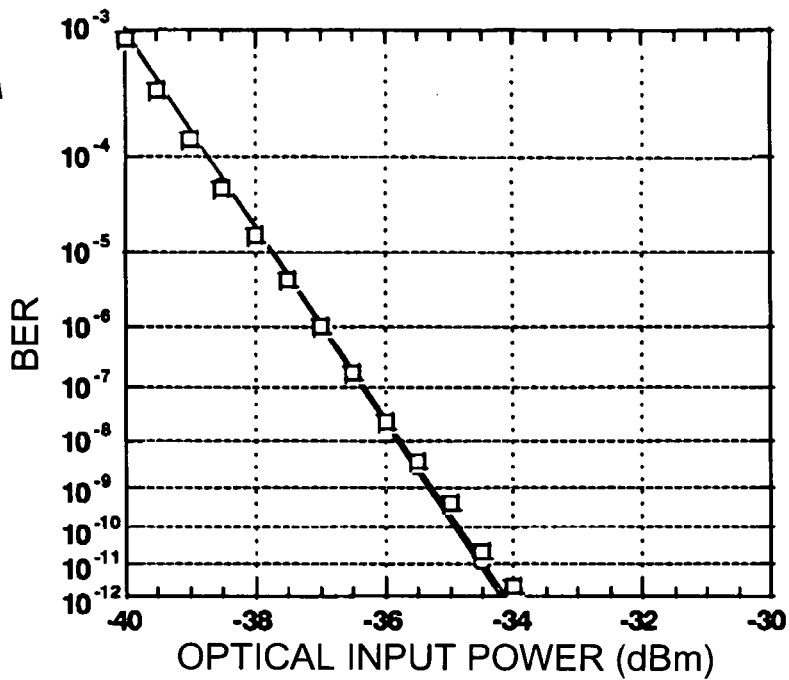
FIGS. 14A to 14C are other views showing a bit error rate, an oscillation spectrum, and an eye pattern, respectively.
Figure 14B:
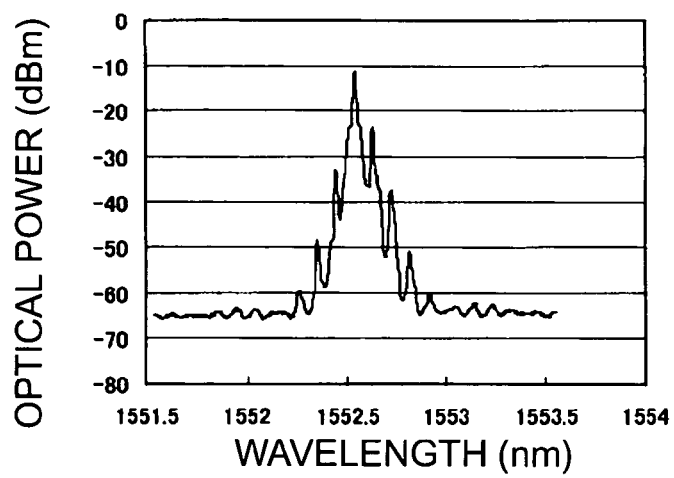
Figure 14C:
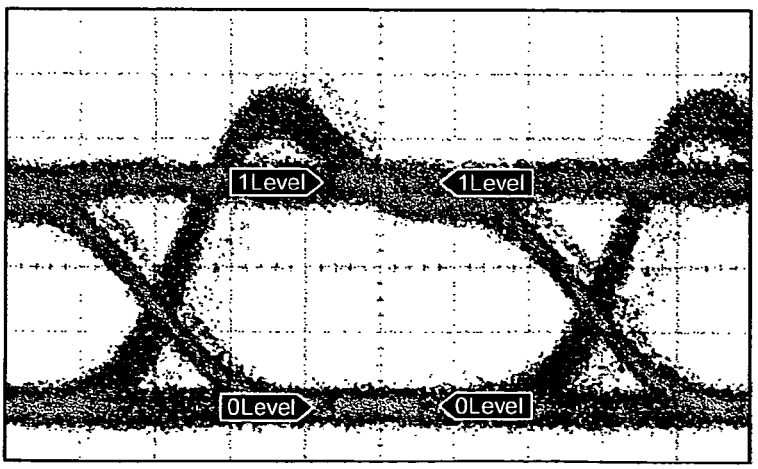

FIGS. 14A to 14C are views showing a bit error rate, an oscillation spectrum, and an eye pattern, respectively, in the case of entering the normal region again after passing through the mode hopping region by means of further increasing the ambient temperature. These characteristics were measured at a temperature of 28.3 degrees centigrade. Referring to FIG. 14A, the power penalty is at a practically acceptable level. Referring to FIG. 14B, a single longitudinal mode oscillates at this temperature. As compared with the maximum peak of this oscillation spectrum, an adjacent peak value is smaller by about 12 dB. Referring to FIG. 14C, jitters are hardly observed.

Based on the above-described results of the measurement, according to the laser module of this embodiment, deterioration in the transmission waveform due to the group delay distortion is not so much as to affect seriously the judgment of 1 and 0 of a signal pulse after transmission, even in the course of multimode oscillation during the mode hopping. This advantage is deemed attributable to the fact that the longitudinal mode interval is 90 picometers or less.

As it can be understood from the above description, the laser module of this embodiment is deemed capable of optical transmission over 40 kilometers or above at the transmission rate of 1.25 gigabits per second at an arbitrary temperature, regardless of whether in the mode hopping region or not. Accordingly, it is possible to realize a coaxial laser module of an non-temperature controlled and pigtail type which can achieve long-distance transmission.

Third Embodiment

Figure 15:
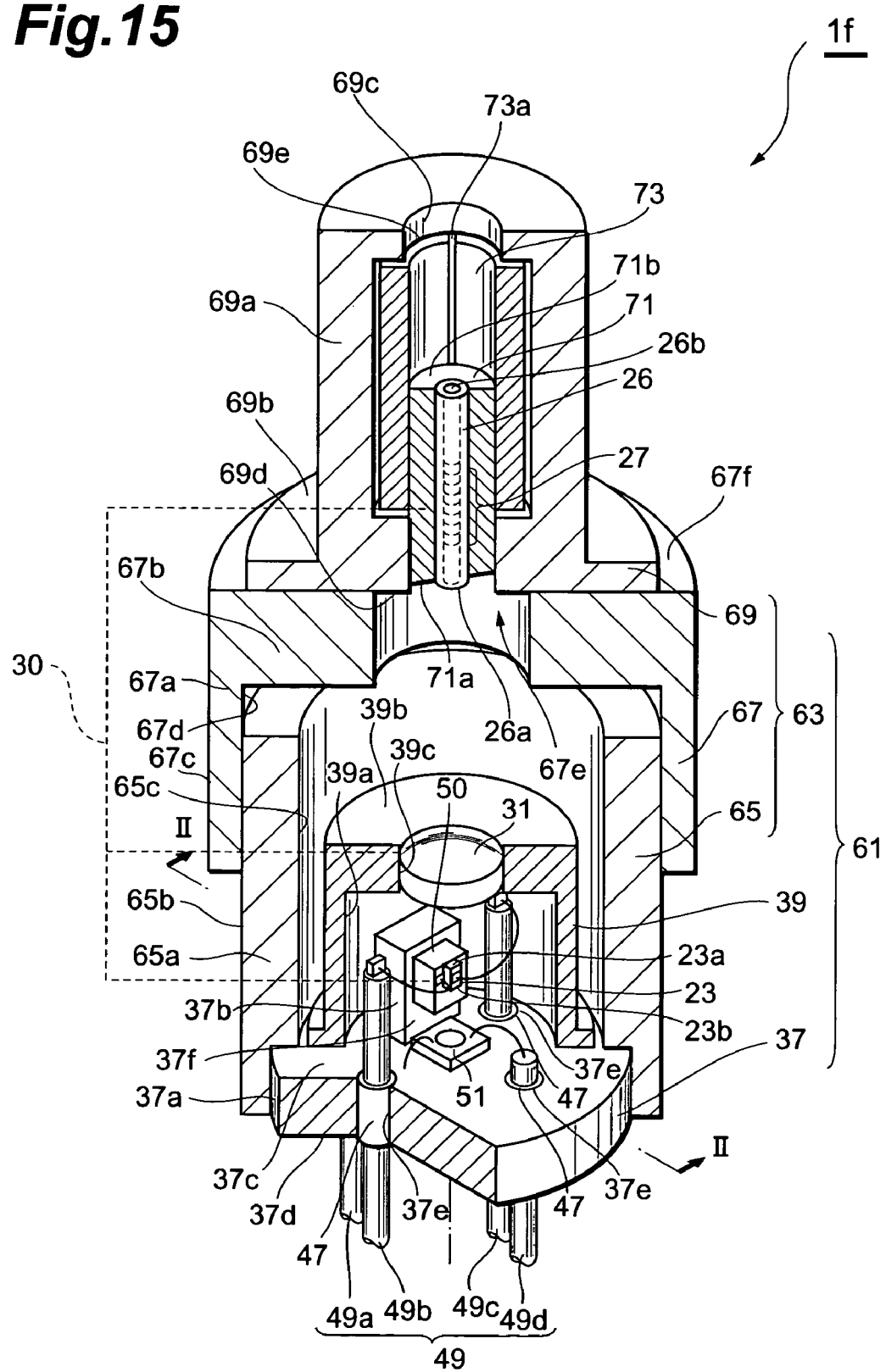
FIG. 15 is a perspective view showing a laser module according to a third embodiment.
Figure 16:
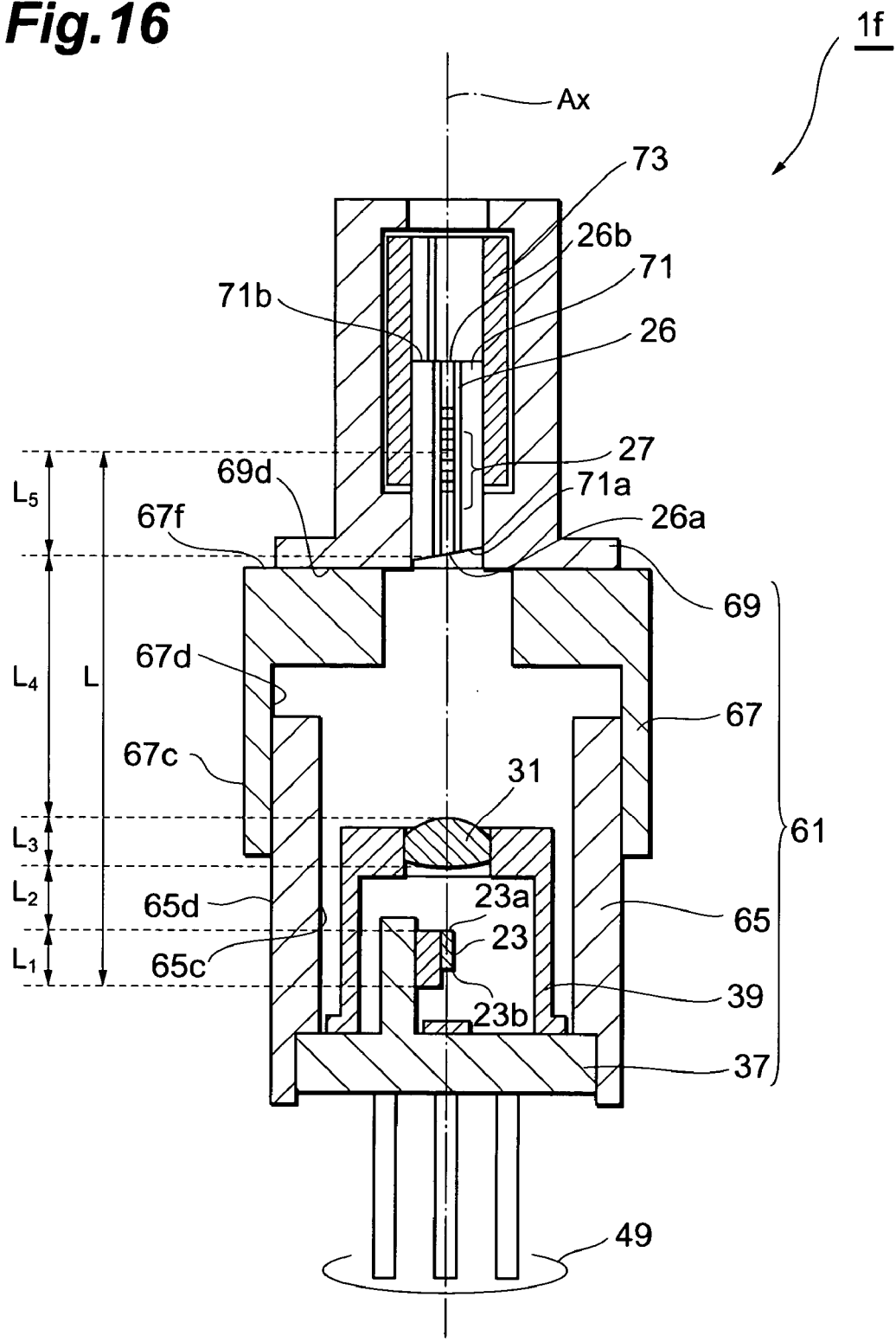
FIG. 16 is a cross-sectional view of the laser module taken along the II—II line in FIG. 15.

FIG. 15 is a perspective view showing a laser module according to a third embodiment. This module is a coaxial laser module of a receptacle type. FIG. 16 is a cross-sectional view of the laser module taken along the II—II line in FIG. 15.

Referring to FIGS. 15 and 16, a laser module 1f includes a semiconductor optical amplifier device 23, a fiber stub 26, and a lens 31. The fiber stub 26 has an end 26a and a diffraction grating 27 which is disposed at a predetermined distance away from the end 26a. The lens 31 optically couples the end 26a of the fiber stub 26 to a first end surface 23a of the semiconductor optical amplifier device 23. The semiconductor optical amplifier device 23, the fiber stub 26, and the lens 31 constitute an external cavity 30. The semiconductor optical amplifier device 23, the fiber stub 26, and the lens 31 are held by a housing 61. In this way, the laser module 1f is configured such that an optical cavity length L of the external cavity 30 is set in a range of 13 millimeters or more but 27 millimeters or less. Since the length of the external cavity 30 of the laser module 1f is longer than that of a conventional one, deterioration in transmission due to group delay distortion attributable to multimode oscillation during mode hopping is suppressed. Accordingly, the laser module 1f can be used as a light source regardless of the occurrence of mode hopping.

Moreover, the laser module 1f may further include a mounting component 37, a lens holding member 39, a short ferrule 71, and a ferrule holding member 63. The short ferrule 71 is provided above the mounting component 37 and holds the fiber stub 26. The ferrule holding member 63 holds the short ferrule 71.

This laser module 1f is suitable for configuring a laser module having a relatively long cavity length.

The housing 61 includes the ferrule holding member 63, the mounting component 37 such as a can package, and the lens holding member 39 such as a lens cap. The ferrule holding member 63 is mounted on the mounting component 37.

The ferrule holding member 63 includes a sleeve 65, a joint sleeve 67 and a ferrule holder 69. The ferrule holder 69 holds the short ferrule 71 via a split sleeve 73, and this short ferrule 71 holds the fiber stub 26. The ferrule holding member 63 holds the short ferrule 71 so as to constitute a receptacle structure.

The sleeve 65 is positioned on the mounting component 37. The sleeve 65 has a sidewall portion 65a extending in a direction of a predetermined axis Ax, and an aligning surface 65b or 65c for aligning the joint sleeve 67 (the aligning surface 65b is used in this embodiment). The aligning surface 65b or 65c is an outer side surface or an inner side surface of the sidewall portion 65a. This outer side surface or inner side surface extends in the direction of the predetermined axis Ax. The length of the sidewall portion 65a of the sleeve 65 is longer than the length of a sidewall portion 39a of the lens holding member 39.

The joint sleeve 67 is disposed on the sleeve 65. The joint sleeve 67 has a sidewall portion 67a extending in the direction of the predetermined axis Ax, and a ceiling potion 67b provided at one end of the sidewall portion 67a. The sidewall portion 67a has an aligning surface 67c or 67d for aligning the joint sleeve 67 with the sleeve 65 (the aligning surface 67d is used in this embodiment). The aligning surface 67c or 67d is an outer side surface or an inner side surface of the sidewall portion 67a. This outer side surface or inner side surface extends in the direction of the predetermined axis Ax. The ceiling portion 67b has an opening 67e therein. The light from the lens 31 reaches the end surface 26a of the fiber stub 26 through the opening 67e. The ceiling portion 67b has a sliding surface 67f. The ferrule holder 69 is positioned on the sliding surface 67f. The joint sleeve 67 can be slid along the sidewall portion 65a of the sleeve 65, and as a result of positioning by such a movement, a desired optical cavity length can be obtained. The ferrule holder 69 is disposed on the joint sleeve 67. The ferrule holder 69 has a sidewall portion 69a extending in the direction of the predetermined axis Ax and a flange portion 69b for positioning itself relative to the sleeve 65. The sidewall portion 69a has an inner side surface 69c for defining a region for inserting the short ferrule 71. The flange portion 69b has a sliding surface 69d for positioning the ferrule holder 69 on the sliding surface 67f. Moreover, the ferrule holder 69 includes a concave portion 69e on the inner side surface 69c thereof. The concave portion 69e is provided with the split sleeve 73. The short ferrule 71 and the fiber stub 26 are positioned by use of the split sleeve 73. The split sleeve 73 has a split 73a.

In the case of the laser module if of a receptacle type, a tip of an optical connector such as an SC connector, an FC connector, or an MU connector, each provided with an optical fiber, is inserted into the split sleeve 73. Then, the tip of the optical connector is closely attached to another end surface 26b on the opposite side to the end surface 26a of the fiber stub 26 and an end surface 71b on the opposite side to another end surface 71a of the short ferrule 71, thereby extracting the light outside. Since the receptacle type does not have a light emission terminal of a pigtail shape, it is possible to downsize the laser module and thereby to facilitate incorporation thereof into a device or the like. Moreover, it is possible to take out an optical fiber to be connected to an emission terminal together with a connector. Accordingly, it is easy to change the type of an optical fiber if necessary and to replace an optical fiber which is defected due to breakage or the like.

Moreover, in a preferred embodiment, as shown in FIGS. 15 and 16, the laser module 1f may be provided with inclined surfaces, which are inclined relative to an optical axis of the fiber stub 26, at the end 26a of the fiber stub 26 and the end surface 71a of the short ferrule 71. Alternatively, as similar to the second embodiment, the laser module 1f may include an anti-reflection film on the end 26a of the fiber stub 26 and on the end surface 71a of the short ferrule 71, instead of the inclined surfaces. It is to be noted that the laser module 1e of the second embodiment may be provided with inclined surfaces, which are inclined relative to an optical axis of the grating fiber 25, at the end surface 25a of the grating fiber 25 and the end surface 45a of the ferrule 45. By the formation of the anti-reflection films or the inclined surfaces, it is possible to effectively suppress reflected light from the end surfaces 25a and 45a, or 26a and 71a of the grating fiber 25 and the ferrule 45, or the fiber stub 26 and the short ferrule 71, respectively, to the semiconductor optical amplifier device 23. In this way, an oscillation state of the fiber grating laser is stabilized.

Figure 17:
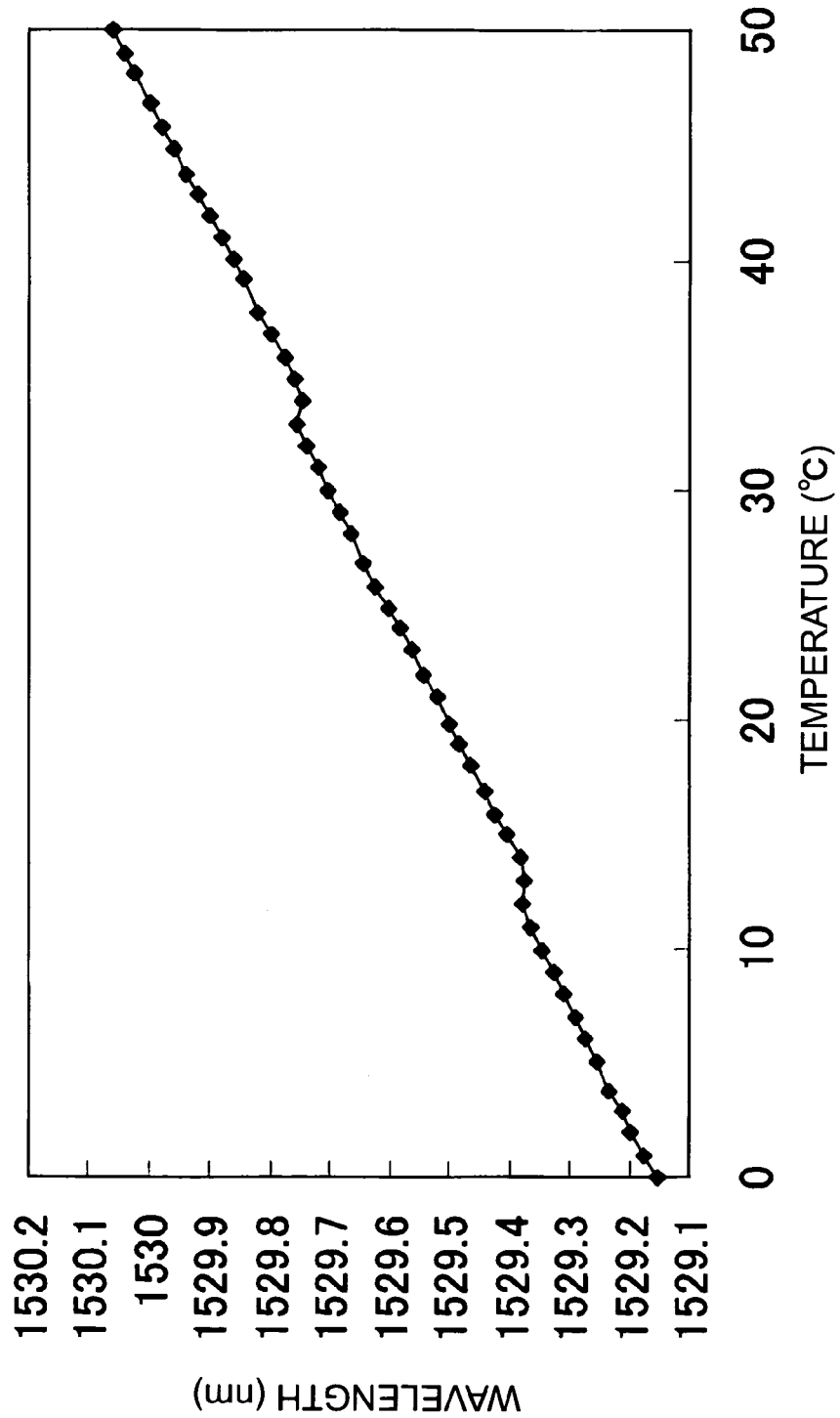
FIG. 17 is a graph showing a temperature characteristic of an oscillation wavelength of the laser module.

FIG. 17 is a graph showing a temperature characteristic of an oscillation wavelength of the laser module. The Bragg wavelength, the peak reflectivity, and the reflection bandwidth (the full width at half maximum) of this fiber grating are 1530 nanometers, 30 percent, and 0.1 nanometer, respectively. The dimensions L1 to L5 of respective portions of the laser module in FIG. 16 are set to 1.11, 1.11, 2.43, 6.54, and 15.77 millimeters, respectively, and the optical cavity length L is 26.96 millimeters. A calculated value of the longitudinal mode interval is about 43 picometers.

The temperature characteristic of the oscillation wavelength of this laser module is measured. Conditions of laser modulation are as follows: a transmission rate at 1.25 gigabits per second; and modulation at an extinction ratio of 10 decibels (dB) by an NRZ signal of PRBS $2^{23}-1$. The result is shown in FIG. 17.

Referring to FIG. 17, mode hopping occurs in the vicinity of a temperature of 13 degrees centigrade and in the vicinity of a temperature of 34 degrees centigrade. A rate of change in the oscillation wavelength due to temperature is 20 picometers per degree in the normal region.

Figure 18A:
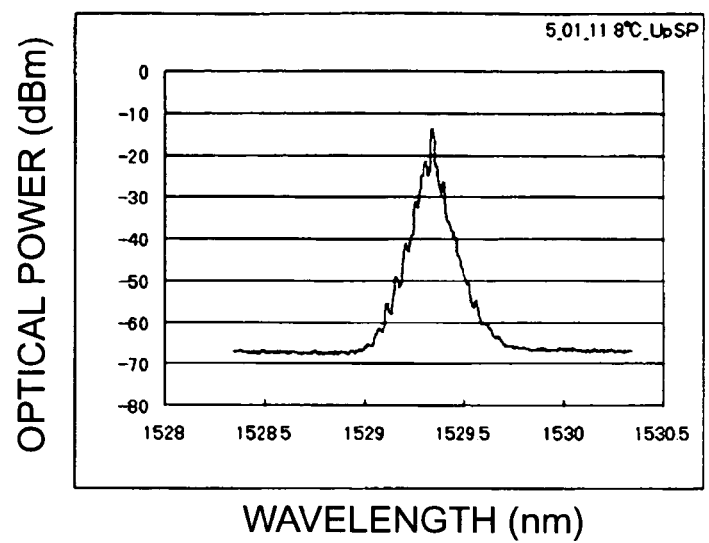
FIGS. 18A to 18C are views showing oscillation spectra at temperatures of 11.8° C., 12.2° C., and 12.4° C., respectively.
Figure 18B:
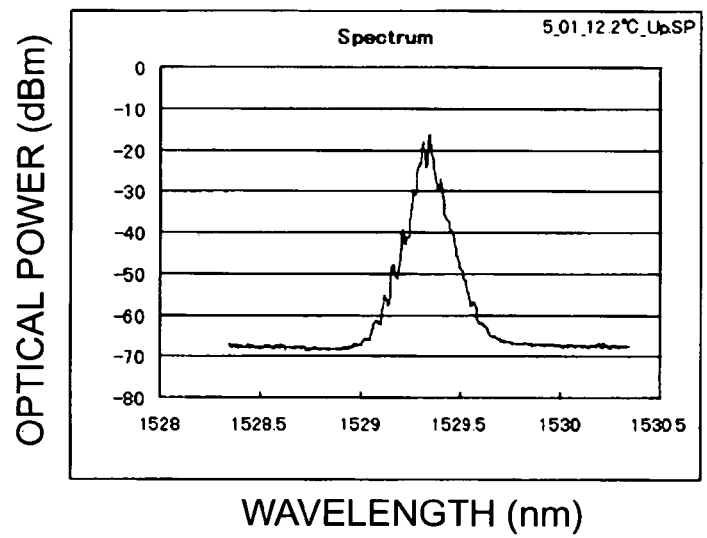
Figure 18C:
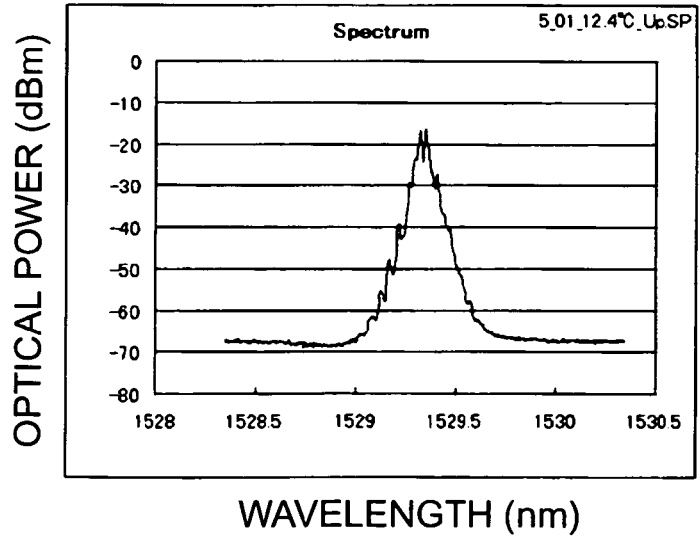
Figure 19A:
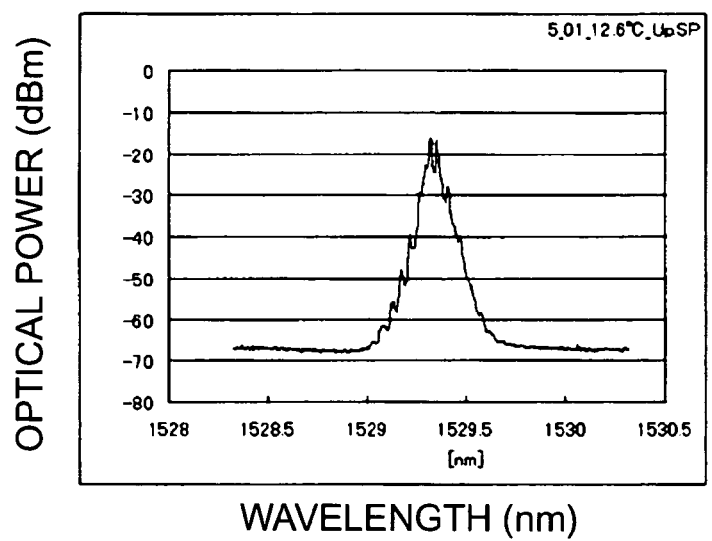
FIGS. 19A to 19C are views showing oscillation spectra at temperatures of 12.6° C., 12.8° C., and 13.0° C., respectively.
Figure 19B:
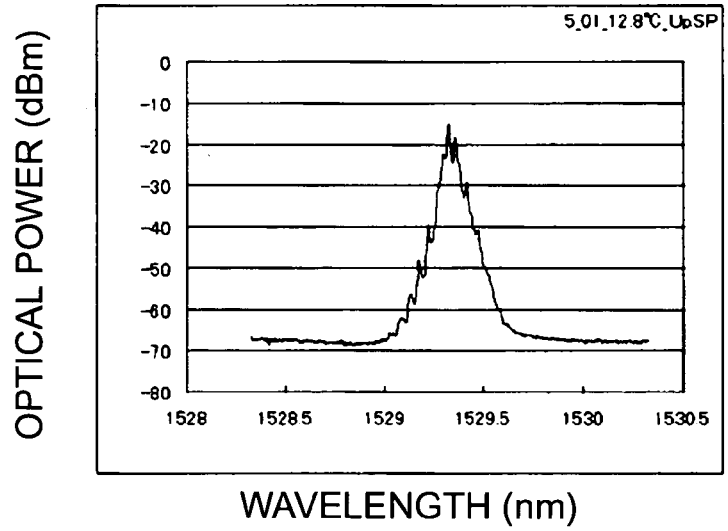
Figure 19C:
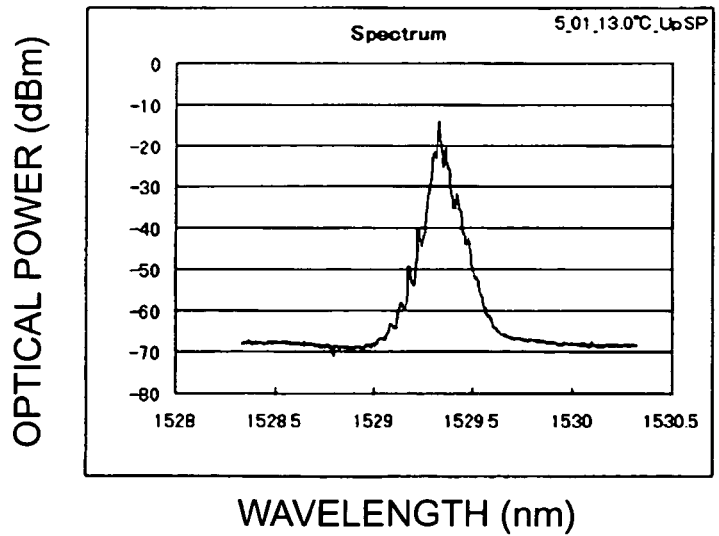

FIGS. 18A to 19C are views showing oscillation spectra at various temperatures in the vicinity of the mode hopping region, such as at 11.8 degrees, 12.2 degrees, 12.4 degrees, 12.6 degrees, 12.8 degrees, and 13.0 degrees, respectively. The longitudinal mode interval is around 45 picometers (pm), which substantially coincides with a calculated value. Referring to FIG. 18A, the laser module is in the normal region at 11.8 degrees centigrade and oscillates in a single longitudinal mode. The mode hopping region begins when the ambient temperature is increased. As apparent from the oscillation spectra at the temperatures of 12.2 degrees, 12.4 degrees, and 12.6 degrees, which are shown in FIG. 18B, FIG. 18C, and FIG. 19A, respectively, the intensities of two longitudinal modes become approximately equal. In a region at these temperatures, the laser module oscillates in multimode. Referring to FIG. 19B, at 12.8 degrees centigrade, the main part of the longitudinal mode for oscillation of the laser module is switched to an adjacent longitudinal mode on the shorter wavelength side. In other words, the mode hopping occurs at this point. Referring to FIG. 19C, at 13.0 degrees centigrade, the laser module is again in the normal region and oscillates in a single longitudinal mode.

Figure 20A:
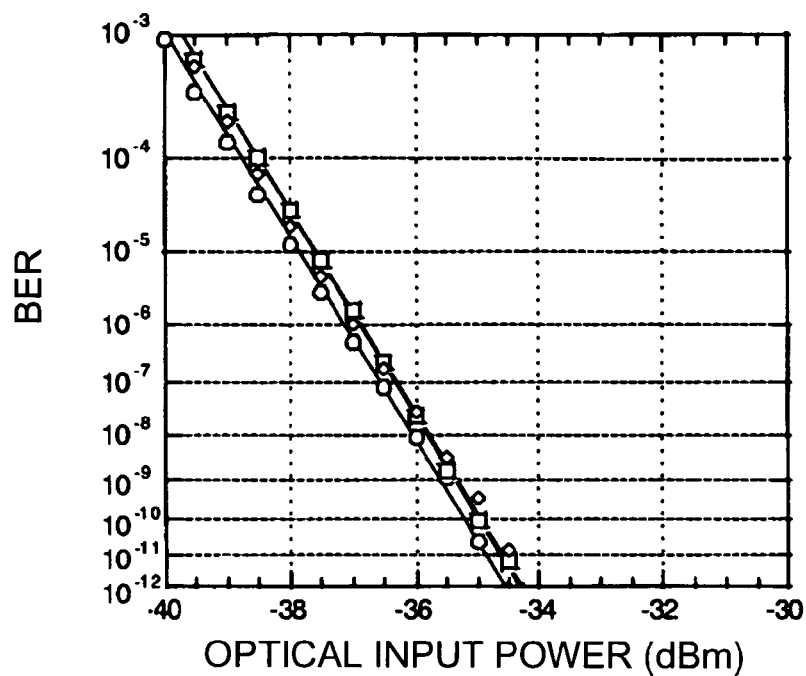
FIG. 20A shows bit error rates in transmission of 40 kilometers (symbol □), in transmission of 80 kilometers (symbol ◇), and in back-to-back transmission (symbol ○).
Figure 20B:
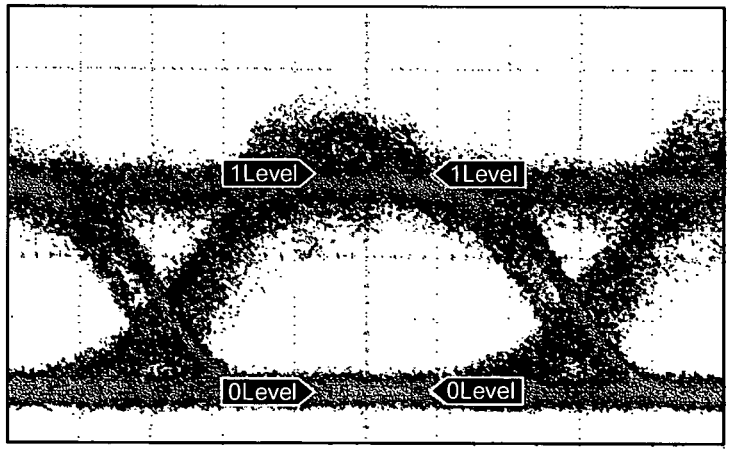
FIG. 20B is a view showing an eye pattern after the transmission of 40 kilometers.
Figure 20C:
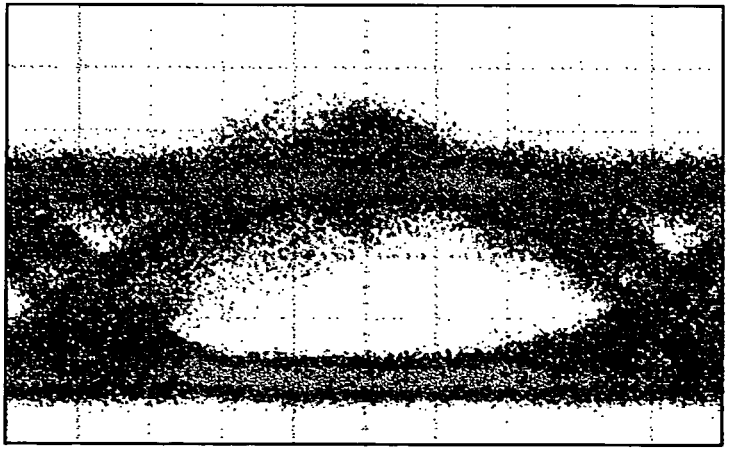
FIG. 20C is a view showing an eye pattern after the transmission of 80 kilometers.

FIGS. 20A to 20C show the results of transmission experiments in the mode hopping region. FIG. 20A shows bit error rates in transmission of 40 kilometers (symbol □), in transmission of 80 kilometers (symbol ◊), and in back-to-back transmission (symbol ○). FIG. 20B is a view showing an eye pattern after the transmission of 40 kilometers. FIG. 20C is a view showing an eye pattern after the transmission of 80 kilometers. The measurement was carried out at a temperature of 12.2 degrees centigrade where the line width of the oscillation spectrum becomes the maximum and the multimode oscillation becomes most significant. Meanwhile, conditions of laser modulation are the same as those in the second embodiment. Referring to FIG. 20A, concerning the bit error rate, a power penalty in the transmission of 80 kilometers is 0.26 decibel or below at a BER value of $10^{-10}$, which is at a practically acceptable level. Referring to FIGS. 20B and 20C, although some jitters are observed, there is no waveform distortion which may affect the judgment of data 1 and 0.

According to the above-described measurement results, deterioration in the transmission waveform due to group delay distortion is not so much as to affect the judgment of 1 and 0 of a signal pulse after transmission even when the laser module of this embodiment oscillates in multimode in the mode hopping region. This advantage is deemed attributable to the fact that the longitudinal mode interval is around 45 picometers (pm).

As it can be understood from the above description, the laser module of this embodiment is deemed capable of optical transmission over 80 kilometers or above at a transmission rate of 1.25 gigabits per second at an arbitrary temperature, regardless of whether in the mode hopping region or not. Accordingly, it is possible to realize a coaxial laser module of a non-temperature controlled and receptacle type which can achieve long-distance transmission.

Moreover, as it can be understood from the results of spectrum measurement shown in FIGS. 11A to 14C, and FIGS. 18A to 19C, in any of the second and third embodiments, the longitudinal modes other than the two modes in the center within the mode hopping region become weaker in intensity by 10 decibels (dB) or above as compared with the two longitudinal modes in the center. Accordingly, group delay distortion attributable to the other longitudinal modes is at an ignorable level. This is because no high reflection can be obtained from the fiber grating 27 for the modes other than the two modes in the closest vicinity of the Bragg wavelength since the full width at half maximum of the reflection spectrum of the fiber grating 27 is narrow, 0.4 nanometer (nm) or below, and so the oscillations in the other modes are considerably suppressed. Therefore, by using a fiber grating having the full width at half maximum of 0.4 nanometer (nm) or below, it is possible to establish two-mode oscillation in the mode hopping region and thereby to suppress the oscillation in multimode in excess of the two modes. Thus, it is possible to suppress the occurrence of signal light containing wavelength components in multimode in excess of two modes, in the laser module. Moreover, it is possible to suppress an increase in transmission delay caused by the oscillation components in multimode in excess of the two modes. In this way, deterioration in transmission is further reduced.

In the second and third embodiments, the end surface 25a of the grating fiber 25 and the end surface 26a of the fiber stub 26 may be lens-shaped end portions. Moreover, the semiconductor optical amplifier device 23 may include a converting portion for converting a spot size of the light emitted from the semiconductor optical amplifier device 23. These structural modifications further strengthen the optical coupling between the semiconductor optical amplifier device 23 and the grating fiber 25 or the fiber stub 26. Accordingly, the characteristics of the laser module are enhanced.

Fourth Embodiment

Figure 21:
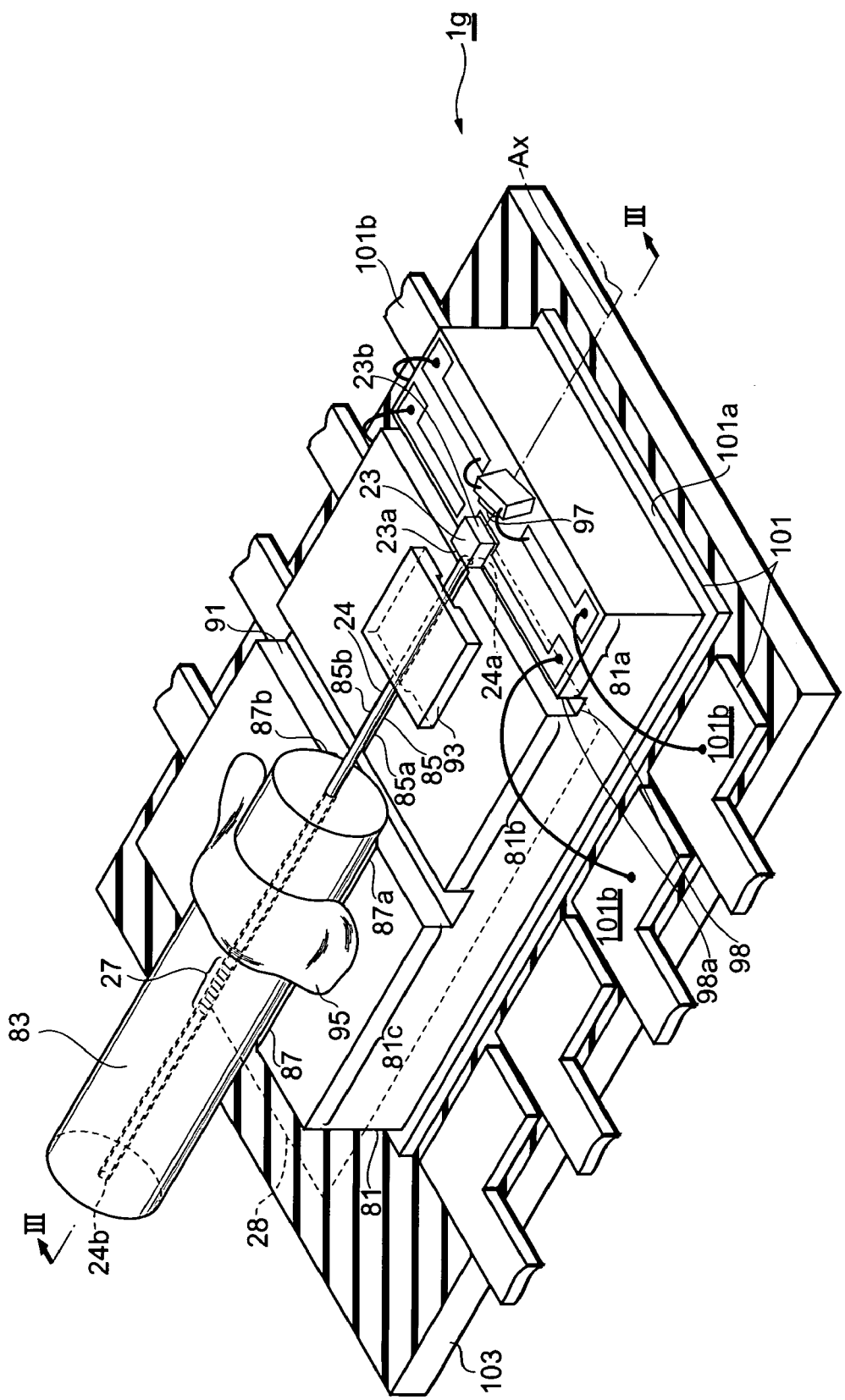
FIG. 21 is a perspective view showing a laser module according to a forth embodiment.
Figure 22:
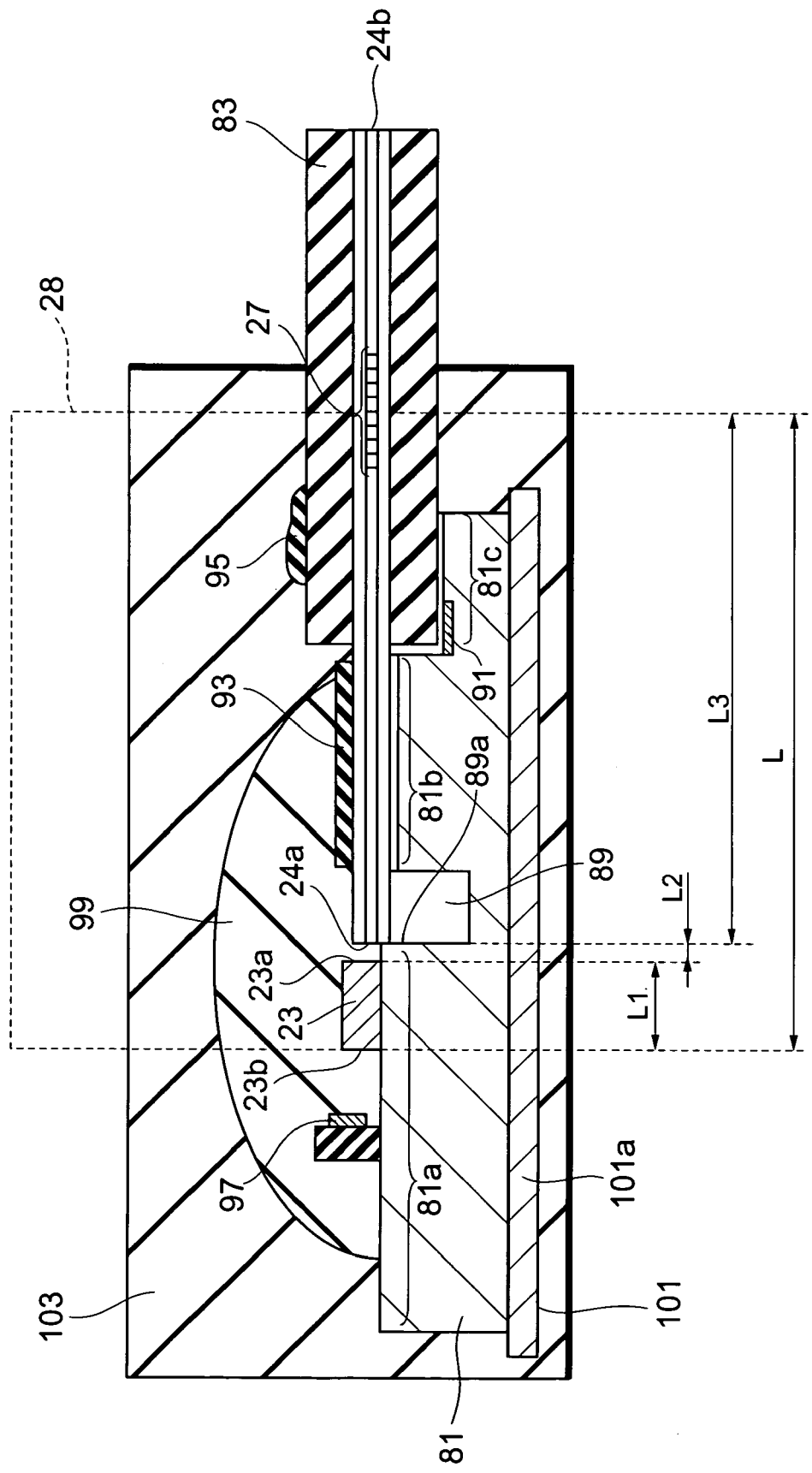
FIG. 22 is a cross-sectional view of the laser module taken along the III—III line in FIG. 21.

FIG. 21 is a perspective view showing a laser module according to a fourth embodiment. This module is a laser module of a surface mounting type. FIG. 22 is a cross-sectional view taken along the III—III line in FIG. 21.

Referring to FIGS. 21 and 22, a laser module 1g includes a semiconductor optical amplifier device 23 and a grating fiber 24. The grating fiber 24 has an end surface 24a, another end surface 24b, and a diffraction grating 27 which is disposed at a predetermined distance away from the end surface 24a. The end surface 24a of the grating fiber 24 is optically coupled to a first end surface 23a of the semiconductor optical amplifier device 23. The semiconductor optical amplifier device 23 and the grating fiber 24 constitute an external cavity 28. The semiconductor optical amplifier device 23 and the grating fiber 24 are held by a component-mounted member 81 such as a silicon bench. In this way, the laser module 1g is configured such that an optical cavity length L of the external cavity 28 is set in a range of 13 millimeters or more but 27 millimeters or less. Since the length of the external cavity 28 of the laser module 1g is longer than that of a conventional one, deterioration in transmission due to group delay distortion attributable to multimode oscillation during mode hopping is suppressed. Accordingly, the laser module 1g can be used as a light source regardless of the occurrence of mode hopping.

Moreover, the laser module 1g may further include the component-mounted member 81 and a ferrule 83. The ferrule 83 holds the grating fiber 24.

The component-mounted member 81 includes first, second and third regions 81a, 81b, and 81c, which are serially arranged along a predetermined axis Ax. The semiconductor optical amplifier device 23 is mounted in the first region 81a. The semiconductor optical amplifier device 23 can be accurately positioned in conformity to a positioning mark on the component-mounted member 81. The second region 81b includes an optical fiber supporting portion 85 for supporting the grating fiber 24. The optical fiber supporting portion 85 extends along the direction of the predetermined axis Ax, and has two side surfaces 85a and 85b for supporting side surfaces of the grating fiber 24. The third region 81c includes a ferrule supporting portion 87 for supporting the ferrule 83. The ferrule supporting portion 87 extends along the direction of the predetermined axis Ax, and has two side surfaces 87a and 87b for supporting side surfaces of the ferrule 83. A positioning surface 98a is provided between the first region 81a and the second region 81b. The positioning surface 98a is provided by a positioning groove 98 which extends in a direction intersecting the predetermined axis Ax. The end surface 24a of the grating fiber 24 is allowed to abut on the positioning surface 98a and thereby positioned. An intermediate groove 91 extending in the direction intersecting the predetermined axis Ax is provided between the second region 81b and the third region 81c.

The laser module 1g further includes a holder member 93 such as a glass plate, and an adhesive member 95. The holder member 93 is disposed on the second region 81b of the component-mounted member 81 and fixes the grating fiber 24 placed on the optical fiber supporting portion 85. The adhesive member 95 is used to fix the ferrule 83 placed on the ferrule supporting member 87.

This laser module 1g is suitable for configuring a laser module having a relatively long cavity length.

Moreover, a monitoring semiconductor photodetector 97 is mounted with high precision in the first region 81a of the component-mounted member 81 with a marker. In addition, referring to FIG. 22, a resin body 99 (which is omitted in FIG. 21) is provided on the component-mounted member 81 in order to protect the semiconductor optical amplifier device 23, the grating fiber 24 and the semiconductor photodetector 97. The resin body 99 covers the semiconductor optical amplifier device 23, the grating fiber 24, and the semiconductor photodetector 97. The resin body 99 provides optical coupling between the end surface 23a of the semiconductor optical amplifier device 23 and the end surface 24a of the grating fiber 24, and optical coupling between the other end surface 23b of the semiconductor optical amplifier device 23 and the semiconductor photodetector 97. The resin body 99 can transmit the light from the semiconductor optical amplifier device 23. The resin body 99 is silicon resin, for example, which is formed by potting. This resin body 99 enhances mechanical strength of the module and improves dampproof characteristics. Preferably, the resin body 99 has refractive index which is close to that of the grating fiber 24. In this way, a quantity of reflected light from the end surface 24a of the grating fiber 24 to the semiconductor optical amplifier device 23 is reduced, and the oscillation characteristic of the laser module 1g is thereby stabilized.

The laser module 1g includes a lead frame 101 and, for example, a thermoplastic epoxy sealing resin 103. The lead frame 101 mounts the assembled component-mounted member 81. The lead frame 101 includes an island 101a and several lead terminals 101b. Using the sealing resin 103, the component-mounted member 81 and the lead frame 101 are sealed by transfer molding.

Referring to FIG. 22, a symbol L1 denotes an optical length of the semiconductor optical amplifier device 23. A symbol L2 denotes an optical interval between the end surface 23a of the semiconductor optical amplifier device 23 and the end surface 24a of the grating fiber 24. Moreover, a symbol L3 denotes an optical interval between the end surface 24a of the grating fiber 24 and the diffraction grating 27. The optical cavity length L of the external cavity 28 is provided as the sum of L1 to L3. For example, it is possible to achieve a longer cavity length, for example, in a range of 13 millimeters or more but 27 millimeters or less by increasing the second and third regions 81b and 81c of the component-mounted member 81.

As it can be understood from the above description, the laser module of this embodiment is deemed capable of optical transmission of 40 kilometers or above at a transmission rate of 1.25 gigabits per second at an arbitrary temperature regardless of whether in the mode hopping region or not. Accordingly, it is understood that a laser module of a non-temperature controlled and surface mounting type capable of long-distance transmission can be realized.

Fifth Embodiment

Figure 23:
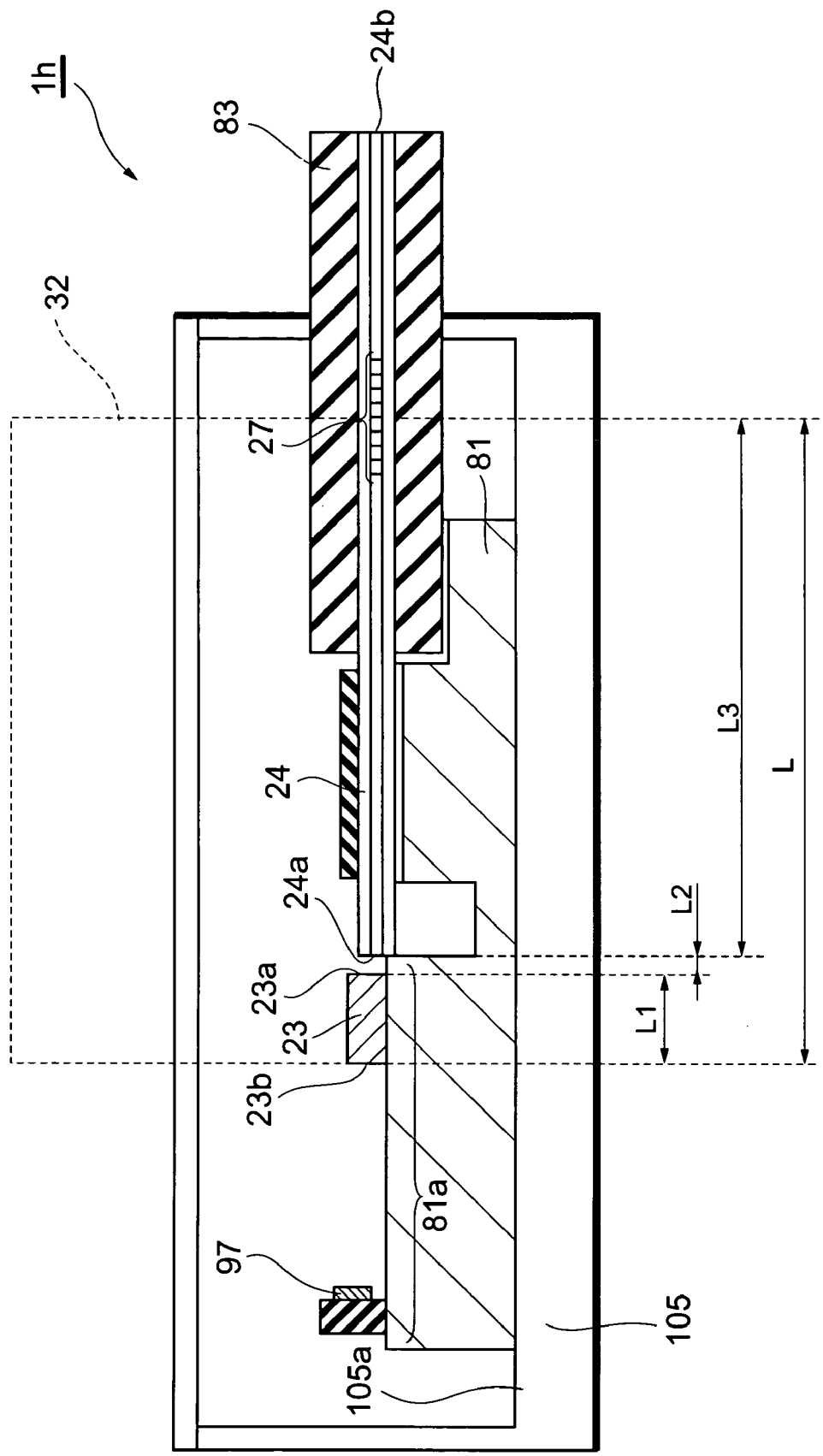
FIG. 23 is a cross-sectional view of a laser module according to a fifth embodiment, taken along a line corresponding to the III—III line in FIG. 21.

FIG. 23 is a cross-sectional view of a laser module taken along a line corresponding to the III—III line shown in FIG. 21. This module is another embodiment of the laser module of a surface mounting type. Referring to FIG. 23, a laser module 1h includes a semiconductor optical amplifier device 23 and a grating fiber 24. The semiconductor optical amplifier device 23 and the grating fiber 24 are held by a component-mounted member 81 such as a silicon bench. In this way, the laser module 1h is configured such that an optical cavity length L of an external cavity 32 is set in a range of 13 millimeters or more but 27 millimeters or less to achieve a transmission rate of 1.25 Gbps. Since the length of the external cavity 32 of the laser module 1h is longer than that of a conventional one, deterioration in transmission due to group delay distortion caused by multimode oscillation during mode hopping is suppressed. Accordingly, the laser module 1h can be used as a light source regardless of the occurrence of mode hopping.

Moreover, the laser module 1h may further include the component-mounted member 81 such as a silicon bench, and a ferrule 83, similarly to the laser module 1g of the fourth embodiment.

The laser module 1h may include a housing 105 such as a mini dual-in-line (MINI-DIL) package. The component-mounted member 81 is disposed on a bottom portion 105a of the housing 105. After the housing 105 is filled with inactive gas such as nitrogen gas, the housing 105 with a metal lid putted thereon is subjected to seam welding. When a metallic film, e.g. an Au film, is provided on a side surface of the ferrule, the relevant portion is sealed by solder.

In the fourth and fifth embodiments, the end surface 24a of the grating fiber 24 may be a lens-shaped end portion. Meanwhile, the semiconductor optical amplifier device 23 may include a converting portion for converting a spot size of the light emitted from the semiconductor optical amplifier device 23. With these structural modifications, the optical coupling between the semiconductor optical amplifier device 23 and the grating fiber 24 is further strengthened. Accordingly, the characteristics of the laser module are improved.

In the fourth and fifth embodiments, it is possible to provide an anti-reflection film to the end surface 24a of the grating fiber 24. Alternatively, it is possible to provide an inclined surface, which is inclined relative to an optical axis of the fiber grating 24, at the end surface 24a of the grating fiber 24. By the formation of the anti-reflection film or the inclined surface, it is possible to effectively suppress reflected light from the end surface 24a to the semiconductor optical amplifier device 23. In this way, an oscillation state of the laser module is more stabilized.

In the fourth and fifth embodiments, a full width at half maximum of a reflection spectrum of the grating fiber 27 may be set to 0.4 nanometer (nm) or below. With this reflection spectrum, as compared with reflectivities of two longitudinal modes (primary modes) in the vicinity of the Bragg wavelength, it is possible to render reflectivities at wavelengths of longitudinal modes other than these primary modes sufficiently small in a mode hopping region. For this reason, with this full width at half maximum, laser oscillations of the longitudinal modes other than the two longitudinal modes (primary modes) in the vicinity of the Bragg wavelength are suppressed and become weaker by 10 decibels (dB) or above than the primary modes, which is at an ignorable level. That is, wavelength components in the other modes do not contribute to optical transmission of a signal. In other words, by using the fiber grating with the full width at half maximum of 0.4 nanometer or below, two-mode oscillation is established in the mode hopping region and the oscillation in multimode in excess of two modes is thereby suppressed. Therefore, it is possible to suppress the occurrence of signal light having wavelength components in multimode in excess of two modes, in the laser module. Moreover, it is possible to prevent an increase in group delay distortion caused by the wavelength components in multimode in excess of the two modes. In this way, deterioration in transmission is further reduced.

In the fourth and fifth embodiments, by using positioning markers and grooves for component arrangement, which are formed on the component-mounted member 81 in advance, all of the semiconductor optical amplifier device 23, the grating fiber 24, the semiconductor photodetector 97, and the like can be mounted with high precision by passive alignment. Therefore, it becomes unnecessary to carry out optical axis alignment between the semiconductor optical amplifier device 23 and the grating fiber 24, and between the semiconductor optical amplifier device 23 and the semiconductor photodetector 97, which is accompanied by an optical axis alignment operation while causing the semiconductor optical amplifier device 23 to emit light. Accordingly, it is possible to save the time of mounting and thereby to reduce manufacturing costs. In this way, it is possible to achieve a reduction in costs of the module.

As described above, by using the laser module of this embodiment, in other words, by using the laser module having the optical cavity length L of the external cavity in a range of 13 millimeters or more but 27 millimeters or less, it becomes possible to achieve optical transmission over 40 kilometers or above at a transmission rate of 1.25 gigabits per second, regardless of the occurrence of mode hopping. Therefore, long-distance transmission becomes possible by use of a non-temperature controlled type laser module. The laser module of this embodiment is applicable to long-distance transmission in an optical communication system such as a metro system or an access system. Moreover, the laser module of this embodiment can be used as a coarse wavelength division multiplexing (CWDM) light source in an optical communication system such as a metro system or an access system. If a laser module of a coaxial structure is used, a low-cost light source can be provided.

Although the principle of the present invention has been described with reference to the drawings in some preferred embodiments, it is obvious to those skilled in the art that various modifications in arrangements and in details are possible without departing from the principle of the present invention. It is to be understood that the present invention is not limited to the specific configurations which have been disclosed throughout the embodiments. Therefore, all modifications and changes are to be encompassed by the scope and spirit of the invention as defined in the appended claims.

What is claimed is:

1. A laser module, comprising an external cavity including:
   a semiconductor optical amplifier device having first and second end surfaces;
   a grating fiber having an end and a diffraction grating; and
   a lens for optically coupling the first end surface and the end together, wherein an optical cavity length of the external cavity is in a range of 13 millimeters or more but 27 millimeters or less,
   the diffraction grating of the grating fiber has a reflection spectrum, and
   a full width at half maximum of the reflection spectrum is 0.4 nanometers or less,
   whereby multimode oscillation of the laser module in excess of two modes is suppressed.

2. The laser module according to claim 1, wherein the end of the grating fiber is a lens-shaped end portion.

3. The laser module according to claim 1, further comprising:
   a mounting component which mounts the semiconductor optical amplifier device;
   a lens holding member which is supported by the mounting component and holds the lens;
   a ferrule which holds the grating fiber; and
   a ferrule holding member which holds the ferrule and is supported by the mounting component,
   wherein the grating fiber has a first portion provided with the diffraction grating, and a second portion of a pigtail shape.

4. The laser module according to claim 1, further comprising:
   a mounting component which mounts the semiconductor optical amplifier device;
   a lens holding member which is supported by the mounting component and holds the lens;
   a ferrule which holds a fiber stub provided with the diffraction grating; and
   a ferrule holding member which holds the ferrule and is supported by the mounting component.

5. A laser module comprising;
   a semiconductor optical amplifier device having first and second end surfaces;
   a grating fiber having an end and a diffraction grating; and
   a component-mounted member for configuring an external cavity by optically coupling the semiconductor optical amplifier device and the grating fiber together, wherein
   the component-mounted member includes an abutting surface on which the end of the grating fiber is abutted,
   the component-mounted member mounts the semiconductor optical amplifier device,
   an optical cavity length of the external cavity is in a range of 13 millimeters or more but 27 millimeters or less,
   the diffraction grating of the grating fiber has a reflection spectrum, and
   a full width at half maximum of the reflection spectrum is 0.4 nanometers or less,
   whereby multimode oscillation of the laser module in excess of two modes is suppressed.

6. The laser module according to claim 5, wherein the end of the grating fiber is a lens-shaped end portion.

7. The laser module according to claim 5, wherein the component-mounted member includes a first region and a second region which are provided along a predetermined axis,
   the semiconductor optical amplifier device is mounted in the first region of the component-mounted member,
   the grating fiber is mounted in the second region of the component-mounted member, and
   the second region of the component-mounted member includes first and second supporting surfaces which support side surfaces of the grating fiber.

8. A laser module, comprising an external cavity including:
   a semiconductor optical amplifier device having first and second end surfaces; and
   a planar optical waveguide having an end and a diffraction grating, wherein an optical cavity length of the external cavity is in a range of 13 millimeters or more but 27 millimeters or less,
   the diffraction grating of the grating fiber has a reflection spectrum, and
   a full width at half maximum of the reflection spectrum is 0.4 nanometers or less,
   whereby multimode oscillation of the laser module in excess of two modes is suppressed.

9. The laser module according to claim 1, further comprising a lead terminal through which the semiconductor optical amplifier device receives a transmission signal.

10. The laser module according to claim 5, further comprising a lead terminal through which the semiconductor optical amplifier device receives a transmission signal.

* * * * *